United States Patent
Shieh

(10) Patent No.: US 7,900,123 B2
(45) Date of Patent: Mar. 1, 2011

(54) METHOD FOR NEAR MAXIMUM-LIKELIHOOD SEQUENTIAL DECODING

(75) Inventor: Shin-Lin Shieh, Kinmen County (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 956 days.

(21) Appl. No.: 11/750,349

(22) Filed: May 18, 2007

(65) Prior Publication Data

US 2007/0283232 A1  Dec. 6, 2007

(30) Foreign Application Priority Data

May 19, 2006   (TW) ................................ 95117819 A

(51) Int. Cl.
*H03M 13/03* (2006.01)
(52) U.S. Cl. .................. 714/794; 714/760; 714/796
(58) Field of Classification Search .................. 714/794, 714/760, 796
See application file for complete search history.

(56) References Cited

U.S. PATENT DOCUMENTS

| | | | |
|---|---|---|---|
| 6,948,114 B2* | 9/2005 | Potkonjak et al. | 714/792 |
| 6,961,392 B2 | 11/2005 | Heegard et al. | |
| 7,103,825 B2* | 9/2006 | Yedidia et al. | 714/760 |
| 7,469,014 B2* | 12/2008 | Abe et al. | 375/262 |
| 2004/0144209 A1* | 7/2004 | Faine et al. | 75/743 |

OTHER PUBLICATIONS

Article title "A Maximum-Likelihood Soft-Decision Sequential Decoding Algorithm for Binary Convolutional Codes" authored by Han et al. IEEE Transactions Letters on communications, vol. 50, No. 2, Feb. 2002 (pp. 173-178).

* cited by examiner

*Primary Examiner* — M. Mujtaba K Chaudry
*Assistant Examiner* — Enam Ahmed
(74) *Attorney, Agent, or Firm* — Jianq Chyun IP Office

(57) ABSTRACT

A method for near maximum-likelihood sequential decoding is provided. According to the method, paths unlikely to become the maximum-likely path are deleted during decoding through a level threshold to reduce decoding complexity. Besides, the method performs maximum-likelihood decoding through sequential decoding by adopting a metric, so that a received signal does not have to go through a hard decision procedure.

21 Claims, 16 Drawing Sheets

METHOD FOR NEAR MAXIMUM-LIKELIHOOD SEQUENTIAL DECODING

CROSS-REFERENCE TO RELATED APPLICATION

This application claims the priority benefit of Taiwan application serial no. 95117819, filed May 19, 2006. All disclosure of the Taiwan application is incorporated herein by reference.

BACKGROUND OF THE INVENTION

1. Field of the Invention

The present invention relates to a sequential decoding method. More particularly, the present invention relates to a method for near maximum-likelihood sequential decoding.

2. Description of Related Art

In today's communication industry, convolution code is generally used for preventing channel noises due to its error correction capability. Convolution code is usually expressed as (n,k,m), that is, each k-bit data block is encoded into an n-bit codeword to be output, and m is a memory length which refers to a number of registers used for encoding. Thus, besides according to the k-bit data block, the encoded n-bit codeword is also related to previous m k-bit data blocks, and the error correction capability of the convolution code is in direct ratio to m.

The encoded n-bit code-words is further related to previous data blocks besides being related to the inputted k-bit data block. Thus, convolution code may also use the previous status and the inputted k-bit data block for outputting the n-bit codeword. Accordingly a trellis diagram is always applied to encoding convolution code for obtaining the statuses and paths that a message sequence will pass through while encoding the message sequence and the n-bit codewords corresponding each path.

FIG. 1 illustrates a trellis diagram of convolution code (3,1,2). In FIG. 1, the length L of the data sequence is assumed to be L=4, that is, every time 4 data blocks are inputted. FIG. 1 illustrates nodes and the paths corresponding to the nodes. Each node is denoted as l–s, wherein l represents level, and l∈{0, 1, 2, 3, 4, 5, 6}; s represents status, and s∈{0, 1, 2, 3}. The paths starting off from each node represent the 3-bit codewords to be output. When l=0~4, two paths start off from each node, the path on top is taken when the data block is 1, and the path below is taken when the data block is 0. Thus, each data block in the inputted message sequence selects the path it will take from the origin node (0-0) to the goal node (6-0), accordingly the codewords to be output are determined.

The methods usually used for decoding convolution code are viterbi decoding and sequential decoding. Wherein, according to viterbi decoding, the metrics of the received sequence and all the possible paths in the trellis diagram are calculated to determine a path having the smallest metric, and the originally transmitted message sequence can be obtained from this path. However, in viterbi decoding, the decision of selecting an existent path has to be made at every status, thus viterbi decoding method presents as the optimum decoding method. However, in actual application, the quantity of calculation or the hardware complexity is in exponential direct ratio to memory length m, thus, viterbi decoding is only suitable for convolution code with shorter memory length. Moreover, since the error correction capability of convolution code is in direct ratio to m, the error correction capability of convolution code can not be fully utilized if viterbi decoding is adopted.

Another decoding method for convolution code is sequential decoding, which is operated in tree diagram, and Fano metric is used for calculating the relationship between the received sequence and possible codewords. Although the calculation quantity and the hardware complexity of sequential decoding method does not grows exponentially to the memory length m, maximum-likelihood decoding cannot be accomplished by sequential decoding, thus, sequential decoding is the sub-optimum decoding in performance.

Yunghsiang S. Han, Po-Ning Chen, and Hong-Bin Wu published an article with title "A Maximum-Likelihood Soft-Decision Sequential Decoding Algorithm for Binary Convolutional Codes" in "Transactions on communications" VOL. 50, No. 2 issued by IEEE (Institute of Electrical and Electronic Engineers) on February, 2002, wherein a method for maximum-likelihood sequential decoding was disclosed and a new metric was provided to replace Fano metric, according to this method, maximum-likelihood decoding can be accomplished by sequential decoding as viterbi decoding performs optimum decoding. Moreover, the new metric cannot be negative, which allows sequential decoding to be operated in trellis diagram.

SUMMARY OF THE INVENTION

Accordingly, the present invention is directed to a method for near maximum-likelihood sequential decoding, wherein paths unlikely to become the maximum-likely path are deleted during decoding through a level threshold to reduce calculation quantity, decoding complexity, and decoding time.

According to another aspect of the present invention, a sequential decoding method is provided, the method performs maximum-likelihood decoding through sequential decoding by adopting a metric, so that a received signal does not have to go through a hard decision procedure, so as to reduce occurrence of errors during decoding process.

The present invention provides a method for near maximum-likelihood sequential decoding, which can be applied to a decoding diagram of convolution code to determine the optimum path in the decoding diagram. Wherein the decoding diagram represents the paths and the corresponding codewords that a message sequence passes through while encoding the message sequence. The decoding method includes following steps. In step (a), a origin node of the decoding diagram is placed into an open stack. In step (b), a level threshold comparison is performed, the smallest metric path in the open stack is deleted when the difference between the level of an end node of the smallest metric path in the open stack and a maximum level is greater than or equal to the level threshold, and the foregoing level threshold comparison is continued until the difference between the level of the end node of the smallest metric path in the open stack and the maximum level is smaller than the level threshold. In step (c), whether the level of the end node of the smallest metric path in the open stack is more than the maximum level is determined, if so, the maximum level is assigned to the level of the end node of the smallest metric path in the open stack and proceed to step (d), otherwise proceed to step (d). In step (d), the metrics of a plurality of successor paths extended from the end node of the smallest metric path in the open stack are calculated. In step (e), the smallest metric path in the open stack is deleted and the successor paths are placed into the open stack. In step (f), whether the smallest metric path in the open stack has ended a goal node of the decoding diagram is determined, wherein if the smallest metric path in the open stack has not ended the goal node of the decoding diagram, steps (b)~(f) are repeated, and if the smallest metric path in the open stack has ended the goal node of the decoding diagram, the smallest metric path is the output path in the decoding diagram.

According to an exemplary embodiment of the present invention, in the near maximum-likelihood sequential decoding method described above, the decoding diagram is, for example, trellis diagram or tree diagram.

According to an exemplary embodiment of the present invention, in the near maximum-likelihood sequential decoding method described above, the metric of the origin node is 0, and setting the value of the level threshold and assign the maximum level as zero are further included before step (a).

According to an exemplary embodiment of the present invention, in the near maximum-likelihood sequential decoding method described above, the open stack is used for storing a plurality of paths, and the paths have a possibility of being the optimum path.

According to an exemplary embodiment of the present invention, in the near maximum-likelihood sequential decoding method described above, step (e) further includes: in step (e1), placing the end node of the smallest metric path in the open stack into a closed stack; in step (e2), deleting the smallest metric path in the open stack; and in step (e3), placing the successor paths into the open stack.

According to an exemplary embodiment of the present invention, in the near maximum-likelihood sequential decoding method described above, step (e3) further includes: eliminating a particular path when the particular path in the successor paths entering any node stored in the closed stack, eliminating a path having higher metric when one of the successor paths merging with a path already stored in the open stack; placing the remaining successor paths into the open stack; arranging the paths stored in the open stack according to their metrics.

According to an exemplary embodiment of the present invention, in the near maximum-likelihood sequential decoding method described above, the convolution code is used for encoding k data bits into an n-bit codeword, the $j^{th}$ codeword corresponding to a path in the decoding diagram is denoted as $x_j$, and $x_j \in \{0, 1\}$, the level of the path in the decoding diagram is denoted as l, and the metric thereof $$\sum_{j=0}^{l \times n-1} (2x_j - 1) \times \phi_j + \sum_{j=0}^{l \times n-1} |\phi_j|, \text{ or } \sum_{j=0}^{l \times n-1} (y_j \oplus x_j)|\phi_j|,$$

wherein k and n are natural numbers, j and l are integers, $\phi_j$ is a real number and a log-likelihood ratio, and the value of $\phi_j$ is log $[Pr(r_j|0)/Pr(r_j|1)]$, $r_j$ is a $j^{th}$ received signal, $Pr(r_j|0)$ represents the possibility of receiving $r_j$ when transmitting 0, $Pr(r_j|1)$ represents the possibility of receiving $r_j$ when transmitting 1. $y_j$ is a hard-decision value, when $\phi_j<0$, $y_j=1$ is determined, and when $\phi_j \geq 0$, $y_j=0$ is determined.

The present invention provides a sequential decoding method suitable for a decoding diagram of a convolution code, the method is used for finding out an optimum path in the decoding diagram, wherein the convolution code encodes k data bits into a n-bit codewords, and the decoding diagram represents the paths including a message sequence passing there-through when encoding the message sequence and codewords corresponding the paths, and a $j^{th}$ codeword corresponding to a path in the decoding diagram is denoted as $x_j$, and $x_j \in \{0, 1\}$, a level of the path of the decoding diagram is denoted as l. The decoding method includes following steps. In step (a), a origin node of the decoding diagram is placed in an open stack. In step (b), the metrics of a plurality of successor paths extended from the end node of the smallest metric path in the open stack are calculated, the metrics thereof are $$\sum_{j=0}^{l \times n-1} (2x_j - 1) \times \phi_j + \sum_{j=0}^{l \times n-1} |\phi_j|,$$

$\phi_j$ is a log-likelihood ratio. In step (c), the smallest metric path in the open stack is deleted and the successor paths are placed in the open stack. In step (d), whether the smallest metric path in the open stack has ended at a goal node of the decoding diagram is determined, wherein if the smallest metric path in the open stack has not ended the goal node of the decoding diagram, steps (b)~(d) are repeated, and if the smallest metric path in the open stack has ended the goal node of the decoding diagram, the smallest metric path is the optimum path in the decoding diagram.

According to an exemplary embodiment of the present invention, in the sequential decoding method described above, k and n are natural numbers, j and l are integers, $\phi_j$ is real number, and the value of $\phi_j$ is log $[Pr(r_j|0)/Pr(r_j|1)]$, $r_j$ is a $j^{th}$ received signal, $Pr(r_j|0)$ represents the possibility of receiving $r_j$ when transmitting 0, $Pr(r_j|1)$ represents the possibility of receiving $r_j$ when transmitting 1.

According to an exemplary embodiment of the present invention, in the sequential decoding method described above, the decoding diagram is, for example, trellis diagram or tree diagram.

According to an exemplary embodiment of the present invention, in the sequential decoding method described above, the metric of the origin node is 0.

According to an exemplary embodiment of the present invention, in the sequential decoding method described above, the open stack is used for storing a plurality of paths, and the paths have a possibility of being the optimum path.

According to an exemplary embodiment of the present invention, in the sequential decoding method described above, step (c) further includes: in step (c1), placing the end node of the smallest metric path in the open stack to a closed stack; in step (c2), deleting the smallest metric path in the open stack; and in step (c3), placing the successor paths into the open stack.

According to an exemplary embodiment of the present invention, in the sequential decoding method described above, step (c3) further includes: eliminating a particular path when the particular path in the successor paths entering any node stored in the closed stack, eliminating a path having high metric when one of the successor paths merging with a path already stored in the open stack, placing the remaining successor paths into the open stack; arranging the paths stored in the open stacked according to their metrics.

According to the present invention, paths unlikely to become the path of maximum-likelihood are deleted during decoding process through a level threshold to reduce calculation quantity, hardware complexity, and decoding time. Moreover, in the present invention, maximum-likelihood decoding is performed through sequential decoding by adopting a metric, so that a received signal does not have to go through a hard decision procedure.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
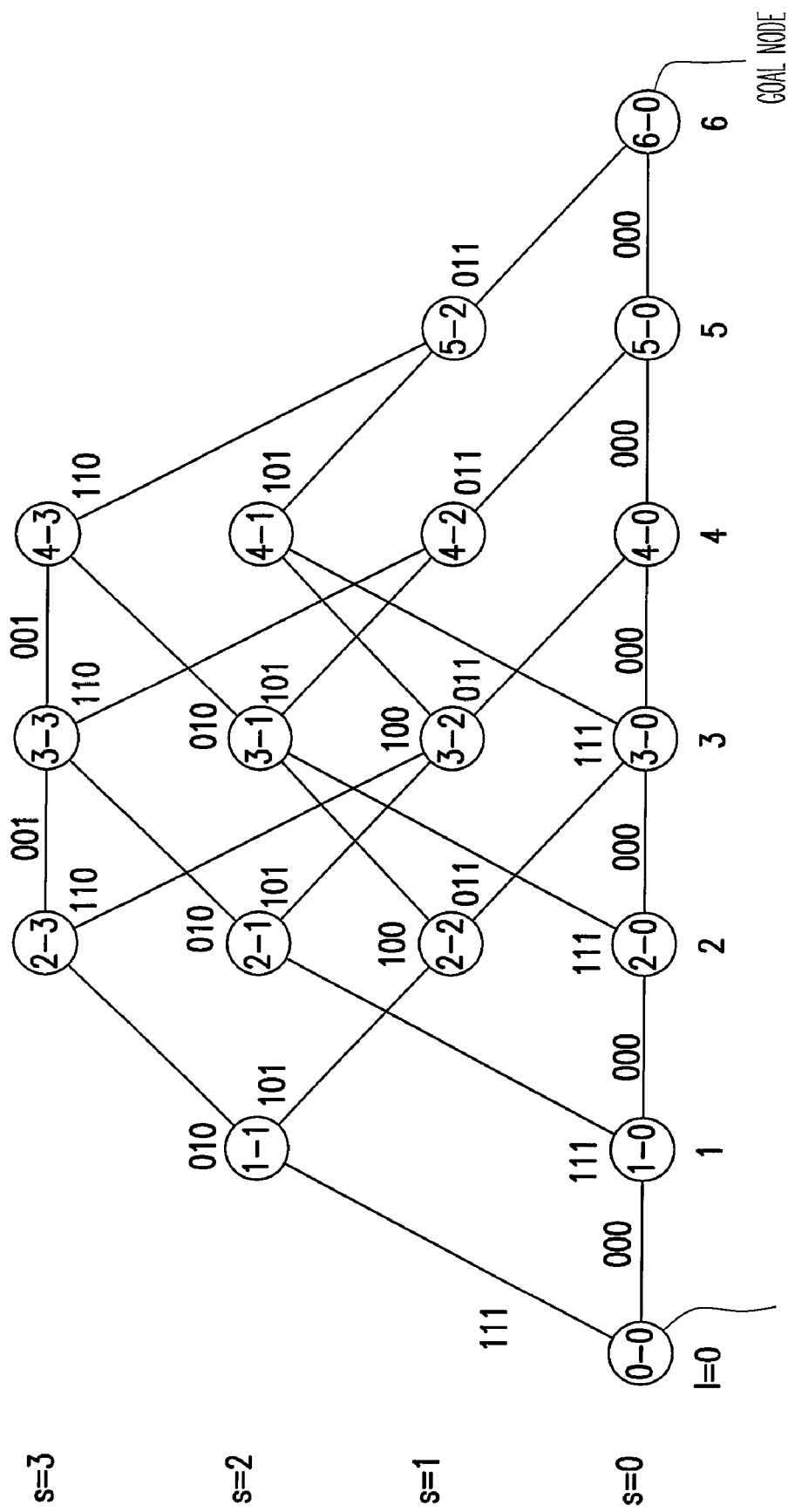
FIG. 1 illustrates a trellis diagram of convolution code (3,1,2).

Generally, convolution code decoding methods are categorized into viterbi decoding and sequential decoding. The present invention is applied to sequential decoding for obtaining maximum-likelihood decoding and reducing the quantity of calculation and decoding time. The present invention can be operated in a decoding diagram for finding out a maximum-likely path in the decoding diagram, and the decoding diagram is, for example, trellis diagram or tree diagram. For the convenience of description, the (n,k,m) of the convolution code in the following embodiments is, for example, (3,1,2), the length of the message sequence is, for example, 4, and the trellis diagram in FIG. 1 is used for explaining the embodiments of the present invention. However, it should be understood by those skilled in the art that such settings are not for limiting the scope of the present invention.

Figure 2:
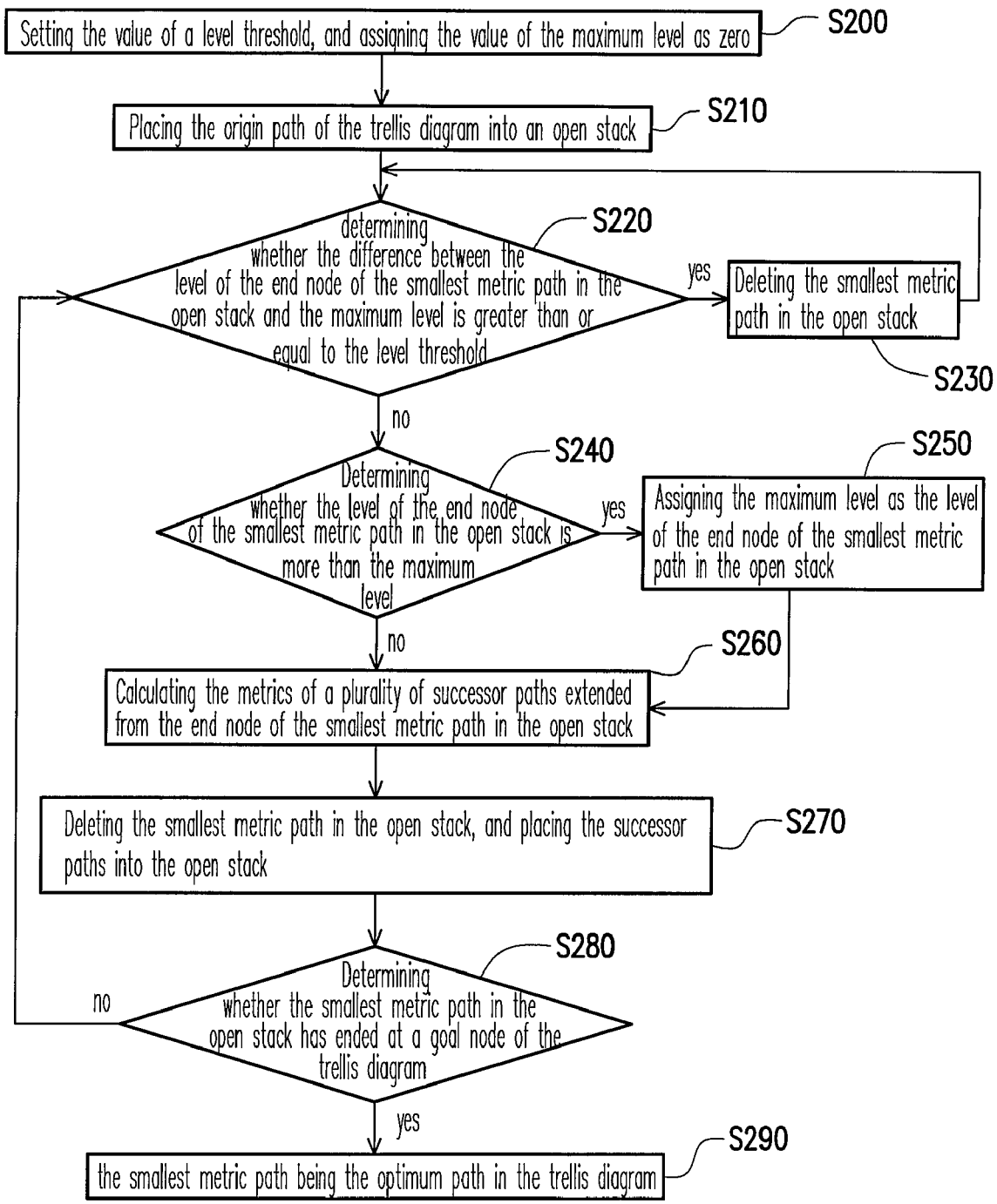
FIG. 2 is a flowchart illustrating the method of near maximum-likelihood sequential decoding according to an embodiment of the present invention.

FIG. 2 is a flowchart illustrating the method of near maximum-likelihood sequential decoding according to an embodiment of the present invention. Referring to FIGS. 1 and 2, first, the value of a level threshold is set, and assign the value of the maximum level as zero (step S200). The value of the level threshold is a non-negative real number, in the present embodiment, which is, for example, 2. In subsequent steps, the value of the maximum level changes along with the level of the end node of the decoded path.

Initially, the first path of the trellis diagram is stored into an open stack (step S210). Wherein, the first path has only a origin node (for example, node 0-0 in FIG. 1), and the metric of the first path is 0. In the present embodiment, the open stack is used for storing a plurality of paths, and the paths stored in the open stack have the possibility of being the optimum path.

Next, a level threshold comparing step is performed to determine whether the difference between the level of the end node of the smallest metric path in the open stack and the maximum level is greater than or equal to the level threshold (step S220).

If the difference between the level of the end node of the smallest metric path in the open stack and the maximum level is greater than or equal to the level threshold, the smallest metric path in the open stack is deleted (step S230), and steps S220 and S230 are repeated until the difference between the level of the end node of the smallest metric path in the open stack and the maximum level is smaller than the level threshold, and then subsequent steps are proceeded to. Here, only the first path is stored in the open stack, thus, the smallest metric path in the open stack is the first path. Since the first path has only the origin node 0-0, so that the end node of the first path is the same node as the origin node 0-0, and since the level l of the origin node 0-0 is 0, and here the maximum level is 0, the subsequent steps are directly proceeded to.

Next, whether the level of the end node of the smallest metric path in the open stack is more than the maximum level is determined (step S240). If the level of the end node of the smallest metric path in the open stack is more than the maximum level, the maximum level is assigned as the level of the end node of the smallest metric path in the open stack (step S250), and then proceed to the subsequent step. Otherwise, directly proceed to the next step. Here, only the first path is stored in the open stack, the end node of the first path is the origin node 0-0, and since level l of the origin node 0-0 is 0 and here the maximum level is 0, the next step is directly proceeded to.

Next, the metrics of a plurality of successor paths extended from the end node of the smallest metric path in the open stack are calculated (step S260). Here, the end node of the smallest metric path in the open stack is the origin node 0-0, for example, in FIG. 1, the paths extended from origin node 0-0 are path 0-0→1-0 and path 0-0→1-1, so that in step S260, the metrics of path 0-0→1-0 and path 0-0→1-1 are calculated. In the present embodiment, the calculation of metrics can be implemented as, for example, the metric calculation provided by Yunghsiang S. Han in "A Maximum-Likelihood Soft-Decision Sequential Decoding Algorithm for Binary Convolutional Codes" and metrics provided by the present invention.

Next, the smallest metric path in the open stack is deleted, and the successor paths are placed into the open stack (step S270). Here the first path stored in the open stack is deleted, and path 0-0→1-0 and path 0-01→1-1 are placed into the open stack. In the present embodiment, the sequence of the successor paths being placed into the open stack is, for example, based on the metric values thereof, for example, from the smallest to the largest or from the largest to the smallest, or the successor paths are placed into the open stack without any particular sequence.

Finally, whether the smallest metric path in the open stack has ended at a goal node of the trellis diagram (for example node 6-0 in FIG. 1) is determined (step S280). If the smallest metric path stored in the open stack has reached the goal node of the trellis diagram, the smallest metric path is the optimum path in the trellis diagram (step S290). If the smallest metric path stored in the open stack has not reached the goal node of the trellis diagram, return to step S220. Here, since none of the paths stored in the open stack (for example, path 0-0→1-0 and path 0-0→1-1 in FIG. 1) has reached the goal of the trellis diagram, step S220 will be returned to. After that, the paths having the possibility of being the optimum path are selected from the paths extended from the end node of path 0-0→1-0 or path 0-0→1-1, and the optimum path of the trellis diagram is decoded according to this pattern.

Below the calculation of the metrics will be explained. First, the received signal is denoted as $r=(r_0, r_1, \ldots, r_N)$, N is the length of the received signal. After the received signal has gone through hard-decision, the sequence obtained is denoted as $y=(y_0, y_1, \ldots y_N)$, wherein any one factor is:

$$y_j = \begin{cases} 1, & \text{if } \phi_j < 0 \\ 0, & \text{if } \phi_j \geq 0 \end{cases}$$

Wherein $\phi_j$ is log-likelihood ratio, which is defined as $$\phi_j = \ln \frac{Pr(r_j|0)}{Pr(r_j|1)}.$$

$Pr(r_j|0)$ represents the possibility of receiving $r_j$ when transmitting 0, and $Pr(r_j|1)$ represents the possibility of receiving $r_j$ when transmitting 1, and $\phi_j$ is a real number.

The codeword on any path in the trellis diagram is denoted as $x_{(l \cdot n-1)}$, and $x_{(l \cdot n-1)}=(x_0, x_1, \ldots, x_{l-1})$, wherein l represents the level of the end node of the path, n represents that every time k data bits are encoded into n codewords, l is a non-negative integer, n and k are natural numbers. With path 0-0→1-1→2-3 in FIG. 1 as example, the end node of the path is 2-3, the level l of the end node 2-3 is 2, and n=3, thus, the codeword of path 0-0→1-1→2-3 is referred to as $x_5$=111010. The metric thereof is defined as $$M_1(x_{(l \cdot n-1)}) \equiv \sum_{j=0}^{l \cdot n-1} (y_j \oplus x_j)|\phi_j| \tag{1}$$

or $$M_2(x_{(l \cdot n-1)}) \equiv \sum_{j=0}^{l \cdot n-1} (2x_j - 1) \times \phi_j + \sum_{j=0}^{l \cdot n-1} |\phi_j| \tag{2}$$

Wherein expression (1) is the metric calculation method provided by Yunghsiang S. Han in "A Maximum-Likelihood Soft-Decision Sequential Decoding Algorithm for Binary Convolutional Codes", and expression (2) is the metric calculation method provided by an embodiment of the present invention. Expression (1) and expression (2) both show that the closer the codeword on the path to the received signal is, the smaller the calculated metric is, and the metrics calculated by expression (1) and expression (2) are both non-negative.

It should be noted that since $y_j$ does not appear in expression (2), the step of hard-decision during decoding can be skipped, so that error occurrences at decision-making can be reduced, accordingly the performance of sequential decoding is improved. For example, when the actual transmission channel is additive white Gaussian noise (AWGN) channel, the log-likelihood ratio $\phi_j=C \cdot r_j$, wherein C is a constant, and expression (2) is changed to $$M_2(x_{(l \cdot n-1)}) \equiv C \cdot \left( \sum_{j=0}^{l \cdot n-1} (2x_j - 1) \times r_j + \sum_{j=0}^{l \cdot n-1} |r_j| \right) \tag{3}$$

It can be observed from expression (3) that the circuit for decision-making can be skipped when the present invention is applied to a receiver circuit for further reducing hardware cost.

To emphasize the advantages of the present invention, another embodiment will be described below to explain the present invention, and expression (2) is used as the method for calculating metrics, the transmission channel is, for example, AWGN channel, thus, the log-likelihood ratio is $\phi_j=C \cdot r_j$, and assuming constant C=1, so expression (2) is changed to $$M_2(x_{(l \cdot n-1)}) \equiv \sum_{j=0}^{l \cdot n-1} (2x_j - 1) \times r_j + \sum_{j=0}^{l \cdot n-1} |r_j| \tag{4}$$

The (n,k,m) of all the convolution codes in following embodiments is, for example, (3,1,2), the length of the message sequence is, for example, 4, the level threshold is, for example, 2, the received signal is r=(−1, −2, 1, −2, −1, 2, −1−3, 2, −1, −3, −2, 1, −2, 3, 2, 2, 1), and the trellis diagram in FIG. 1 is used for describing the embodiments in the present invention. However, it should be understood by those skilled in the art that such settings are not for limiting the scope of the present invention.

Figure 3:
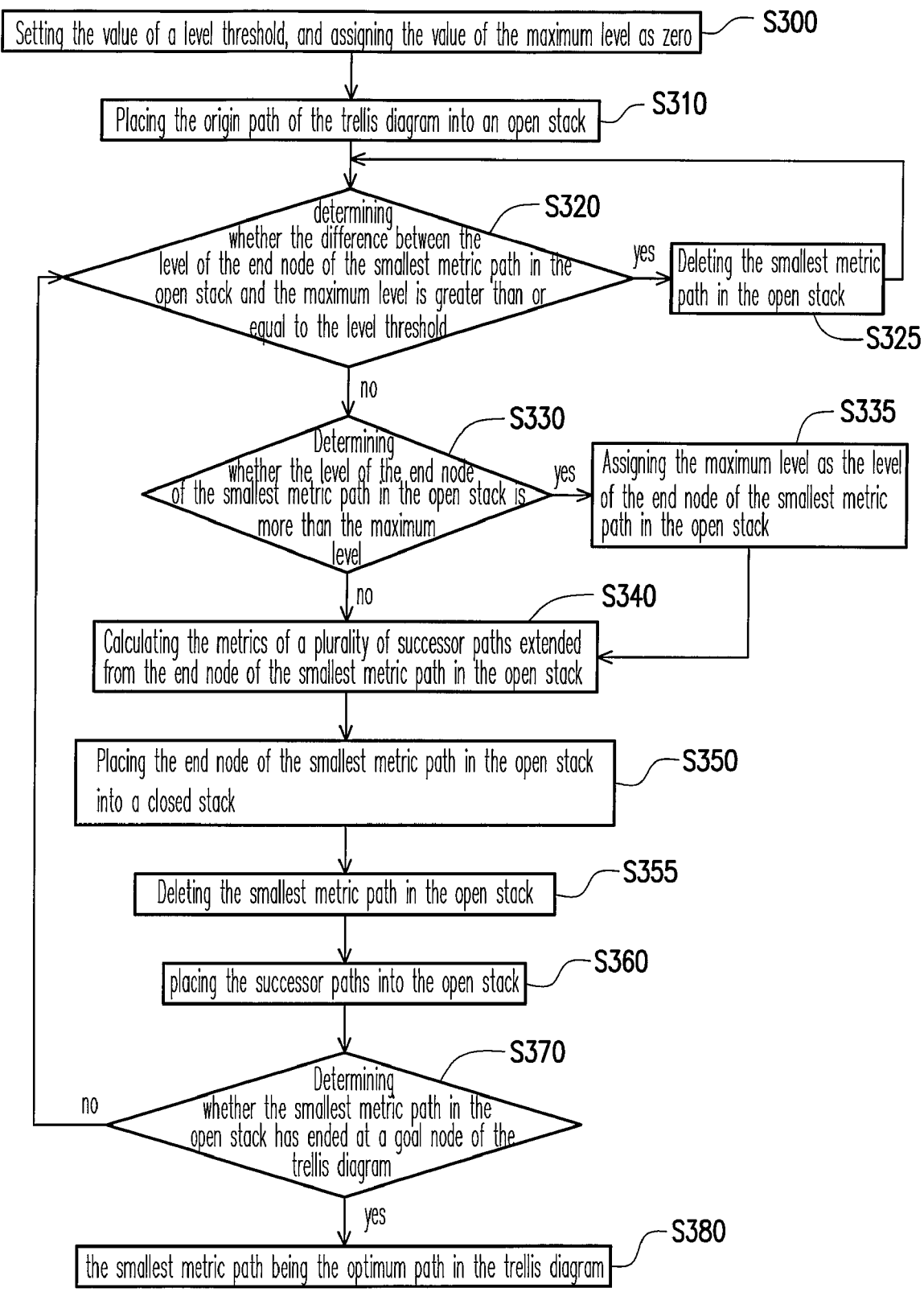
FIG. 3 is a flowchart illustrating the method of near maximum-likelihood sequential decoding according to another embodiment of the present invention.

FIG. 3 is a flowchart illustrating the method of near maximum-likelihood sequential decoding according to another embodiment of the present invention. Referring to FIGS. 1 and 3, steps S300~S335 in FIG. 3 are the same as steps S200~S250 in FIG. 2, therefore will not be described herein. Next, in step S340, the metrics of a plurality of successor paths extended from the end node of the smallest metric path in the open stack are calculated. Here, only the first path is stored in the open stack, and the first path has only the origin node 0-0, thus, the end node of the first path is the same node as the origin node thereof. The successor paths extended from origin node 0-0 are path A (for example, path 0-0→1-0 in FIG. 1) and path B (for example, path 0-0→1-1 in FIG. 1), wherein the codeword corresponding to path A is $x_2$=000, and the codeword corresponding to path B is $x_2$=111. Both path A and path B have levels 0→1, and the corresponding received signal r=(−1, −2, 1), accordingly, the metric of path A can be obtained from expression (4) as $M_2$=6, and the metric of path B as $M_2$=2.

Next, the end node of the smallest metric path in the open stack is placed into a closed stack (step S350). Here, only the first path is stored in the open stack, and the end node of the first path is the origin node 0-0, thus, the origin node 0-0 is placed into the closed stack. In the present embodiment, the closed stack is used for storing a plurality of nodes, and the nodes stored in the closed stack store the information of the nodes which have been the end nodes of the smallest metric paths in the open stack, the end node information thereof is the level and the status of the end node. In other words, when the end node of any path is the same as a node stored in the closed stack, the path will go no further.

Next, the smallest metric path in the open stack is deleted (step S355). Here, only the first path is in the open stack, thus, the first path is deleted. Next, the successor paths are placed into the open stack (step S360). Wherein, step S360 further includes a plurality of sub-steps as shown in FIG. 4.

Figure 4:
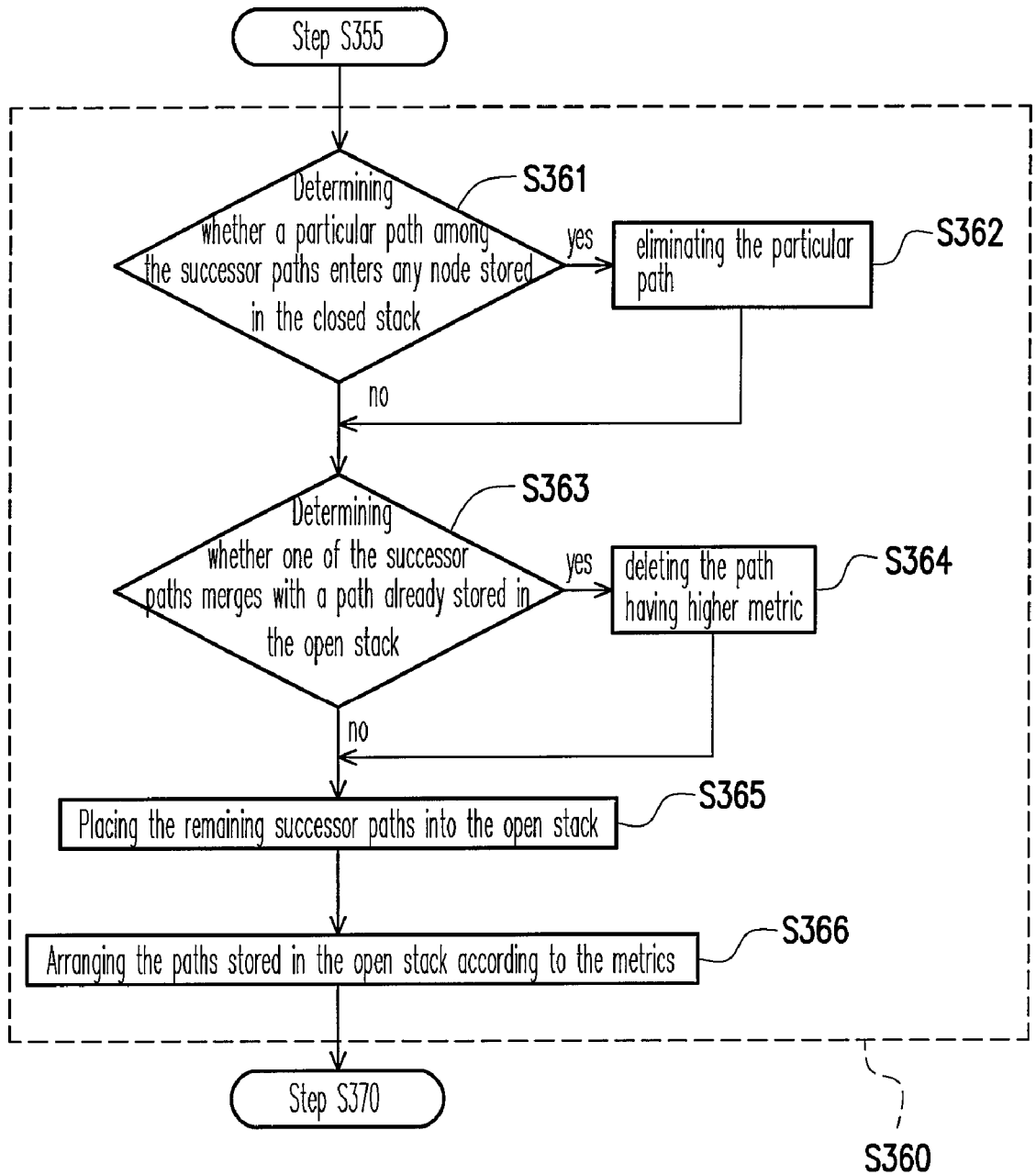
FIG. 4 illustrates the sub-steps of step S360 in FIG. 3.

FIG. 4 illustrates the sub-steps of step S360 in FIG. 3. Referring to FIGS. 1, 3, and 4, whether a particular path among the successor paths enters any node stored in the closed stack is determined (step S361) after step S355. If so, the particular path is eliminated (step S362), and then subsequent steps are proceeded to. If there is no such a particular path among the successor paths, directly proceed to the next step. Here, the successor paths are path A and path B, and there is only the origin node 0-0 in the closed stack, thus, the subsequent steps are directly proceeded to.

Next, whether one of the successor paths merges with a path already stored in the open stack is determined (step S363). If one of the successor paths merges with a path stored in the open stack, the path having higher metric is deleted (step S364) and subsequent steps are proceeded to. Otherwise, subsequent steps are directly proceeded to. Here, since there is no path stored in the open stack, the subsequent steps are directly proceeded to.

Figure 5:
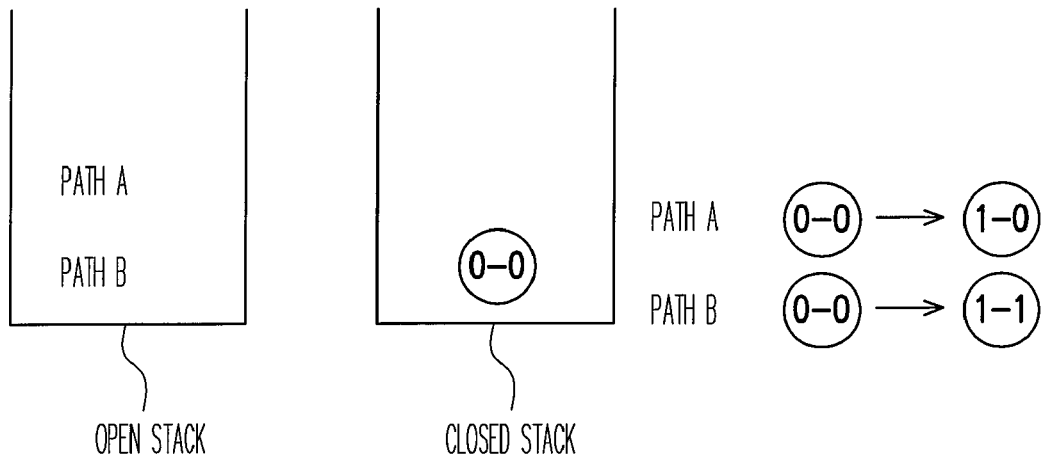
FIG. 5 illustrates paths stored in an open stack and nodes stored in a closed stack.

Next, the remaining successor paths are placed into the open stack (step S365) and the paths stored in the open stack are arranged according to the metrics thereof (step S366). In the present embodiment, the sequence of the paths arranged in the open stack is based on the metrics thereof, for example, from the smallest to the largest. Here, the successor paths are path A and path B, and path A and path B are stored in the open stack, and since the metric of path A is $M_2$=6 and metric of path B is $M_2$=2, the sequence thereof in the open stack is path B followed by path A, and the information in the open stack and the closed stack here is illustrated in FIG. 5. FIG. 5 illustrates paths stored in an open stack and nodes stored in a closed stack. It should be understood by those skilled in the art that before executing step S365, if the paths in the open stack have been arranged based on the metrics thereof, then the successor paths can be inserted according to the metrics thereof into the paths which have been arranged according to their metrics in the open stack in step S365, so that the arrangement operation in step S366 can be skipped and all the paths stored in the open stack can still be arranged according to the metrics thereof.

Finally, referring to FIG. 3, subsequent steps are continued to be executed, whether the smallest metric path in the open stack has reached the goal node of the trellis diagram is determined (step S370). If the smallest metric path in the open stack has reached the goal node of the trellis diagram, the smallest metric path is the optimum path of the trellis diagram (step S380). Otherwise, return to step S320. In the present embodiment, the goal node of the trellis diagram is, for example, node 6-0 in FIG. 1, and here the smallest metric path in the open stack is path B which ends at node 1-1, thus step S320 is returned to.

Next, in step S320, the smallest metric path in the open stack is path B, the end node of path B is node 1-0, the level of node 1-0 is 1, and the difference thereof with the maximum level (here the maximum level is 0) is smaller than the level threshold (in the present embodiment, the level threshold is, for example, 2), thus, step S330 is directly executed.

In step S330, the level of the end node of path B (here it is 1) is greater than the maximum level (here it is 0), thus, step S325 is executed to set the maximum level to 1 and continue to proceed to step S340.

In step S340, the successor paths extended from the end node 1-1 of path B are path C (for example, path 0-0→1-1→2-3 in FIG. 1) and path D (for example, path 0-0→1-1→2-2 in FIG. 1), and the codeword on path C is $x_5$=111 010, the codeword on path D is $x_5$=111 101. Moreover, both path C and path D have levels 0→2, and the corresponding received signal is r (−1, −2, 1, −2, −1, 2), thus, the metric of path C can be obtained from expression (4) as $M_2$=6, and the metric of path D is $M_2$=8.

Figure 6:
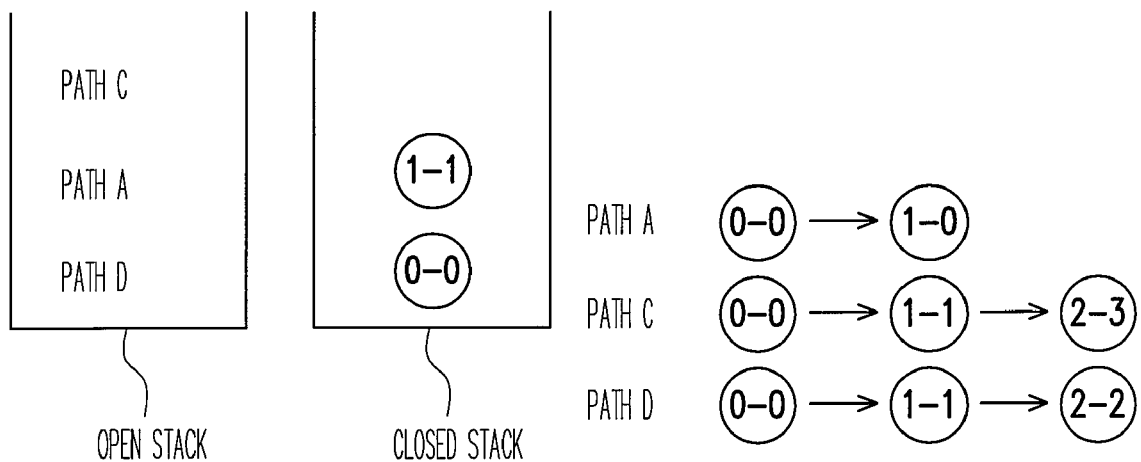
FIG. 6 illustrates paths stored in an open stack and nodes stored in a closed stack.

Next, in step S350, the end node 1-1 of path B is placed into the closed stack. Then, in step S355, path B is deleted from the open stack. Since neither of the successor paths (path C and path D) complies with the expressions in steps S361 and S363, step S365 is directly executed to place the successor paths (path C and path D) into the open stack. Here, paths A, C, and D are stored in the open stack, and metric of path A is $M_2$=6, metric of path C is $M_5$=6, and metric of path D is $M_5$=8, thus in step S366, the sequence of the paths in the open stack is as paths C, A, D, and the information in the open stack and the closed stack here is illustrated in FIG. 6. FIG. 6 illustrates paths stored in an open stack and nodes stored in a closed stack.

Finally, in step S370, the smallest metric path in the open stack (here it is path C) does not reach the goal node 6-0 of the trellis diagram, thus, the process returns to step S320.

Figure 7:
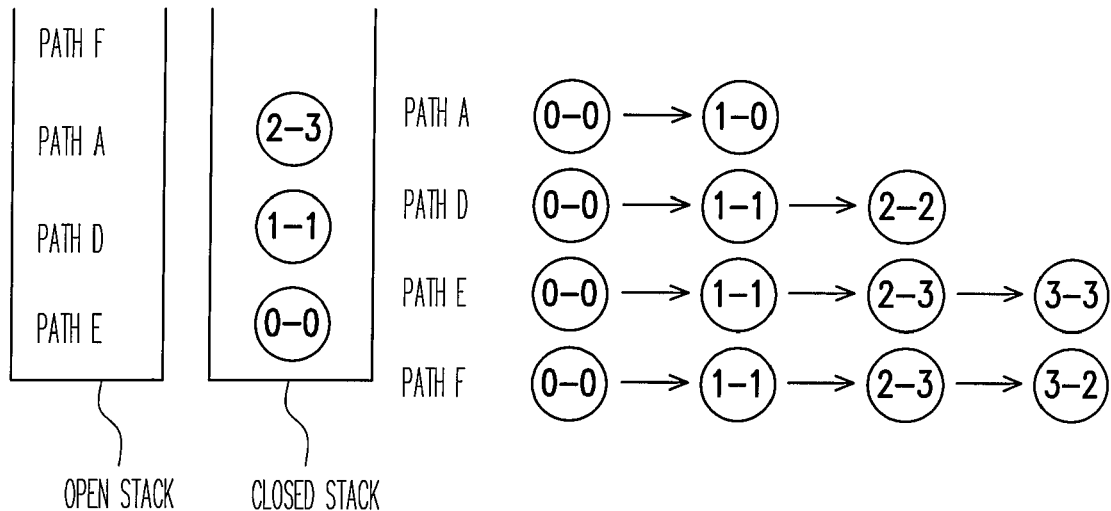
FIG. 7 illustrates paths stored in an open stack and nodes stored in a closed stack.

Next, the maximum level is set to the level of the end node of path C, thus here the maximum level is 2. Then path E (for example, path 0-0→1-1→2-3→3-3 in FIG. 1) and path F (for example, path 0-0→1-1→2-3→3-2 in FIG. 1) are extended from the end node 2-3 of path C, the metric of path E is calculated to be $M_2$=18, metric of path F is $M_2$=6, node 2-3 is placed into the closed stack, and path C is deleted. After that, path E and path F are placed into the open stack, the sequence of the paths in the open stack is as paths F, A, D, E, and the information of the open stack and the closed stack here is illustrated in FIG. 7. FIG. 7 illustrates paths stored in an open stack and nodes stored in a closed stack. Since path F does not reach the goal node 6-0 of the trellis diagram, the process returns to step S320.

Here, the smallest metric path in the open stack is path F, and through the expressions in steps S320 and S330, the maximum level is set to the level of the end node of path F.

Figure 8:
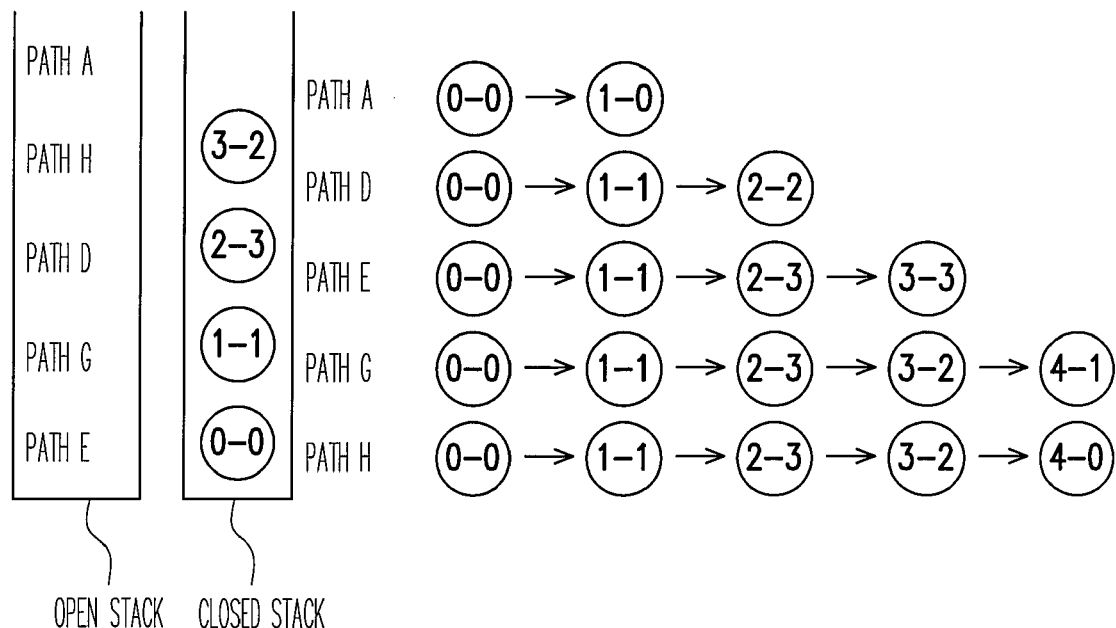
FIG. 8 illustrates paths stored in an open stack and nodes stored in a closed stack.

Thus, the maximum level here is 3. Path G (for example, path 0-0→1-1→2-3→3-2→4-1 in FIG. 1) and path H (for example, path 0-0→1-1→2-3→3-2→4-0 in FIG. 1) are extended from the end node 3-2 of path F, the metric of path G is calculated to be $M_2=16$, metric of path H is $M_2=8$, node 3-2 is placed into the closed stack, and path F is deleted. After that, path G and path H are placed into the open stack, and the sequence of the paths in the open stack is as paths A, H, D, G, E, and the information of the open stack and the closed stack here is illustrated in FIG. 8. FIG. 8 illustrates paths stored in an open stack and nodes stored in a closed stack. Since path A dose not reach the goal node 6-0 of the trellis diagram, the process returns to step S320.

Next, in the expression of step S320, because the smallest metric path in the open stack is path A, the level of the end node 1-0 of path A is 1, and here the maximum level is 3, the difference between the level of the end node of path A and the maximum level is 2, which is equal to the level threshold, thus, step S325 is executed to delete path A, and then the process returns to step S320.

Figure 9:
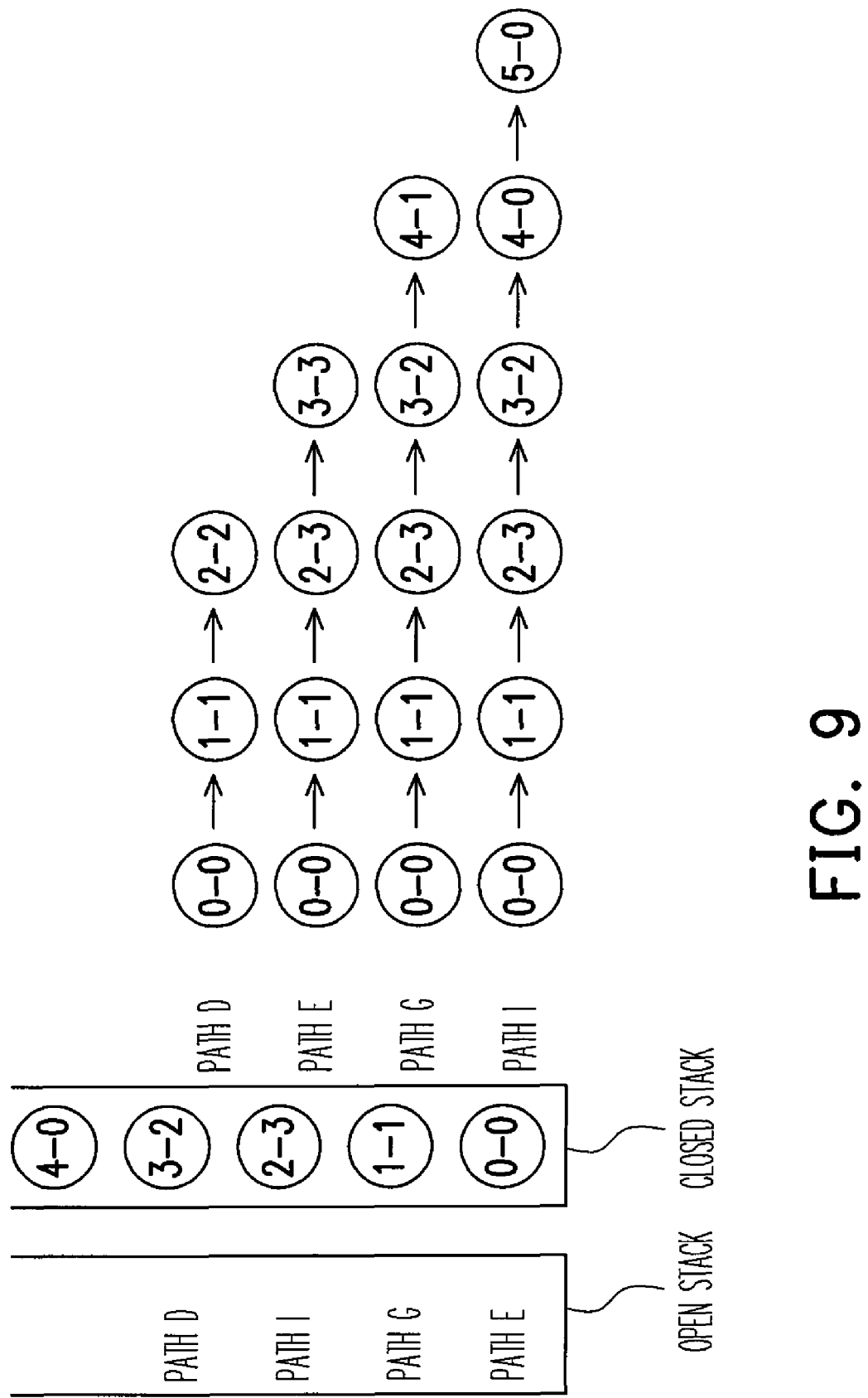
FIG. 9 illustrates paths stored in an open stack and nodes stored in a closed stack.

Since path A has been deleted, the smallest metric path in the open stack is path H, and through the expressions in steps S320 and S330, the maximum level is set to the level of the end node of path H, thus, here the maximum level is 4. Path I (for example, path 0-0→1-1→2-3→3-2→4-0→5-0 in FIG. 1) is extended from the end node 4-0 of path H, and the metric of path I is calculated to be $M_2=12$, node 4-0 is placed into the closed stack, and path H is deleted. After that, path I is placed into the open stack, and the sequence of the paths in the open stack is as paths D, I, G, E, the information of the open stack and the closed stack here is illustrated in FIG. 9. FIG. 9 illustrates paths stored in an open stack and nodes stored in a closed stack. Because path D does not reach the goal node 6-0 of the trellis diagram, the process returns to step S320.

Next, in the expression in step S320, because the smallest metric path in the open stack is path D, and the level of the end node (for example, node 2-2 in FIG. 1) of path D is 2, and here the maximum level is 4, the difference between the level of the end node of path D and the maximum level is 2, which is equal to the level threshold, thus step S325 is executed to delete path D, and the process returns to step S320.

Figure 10:
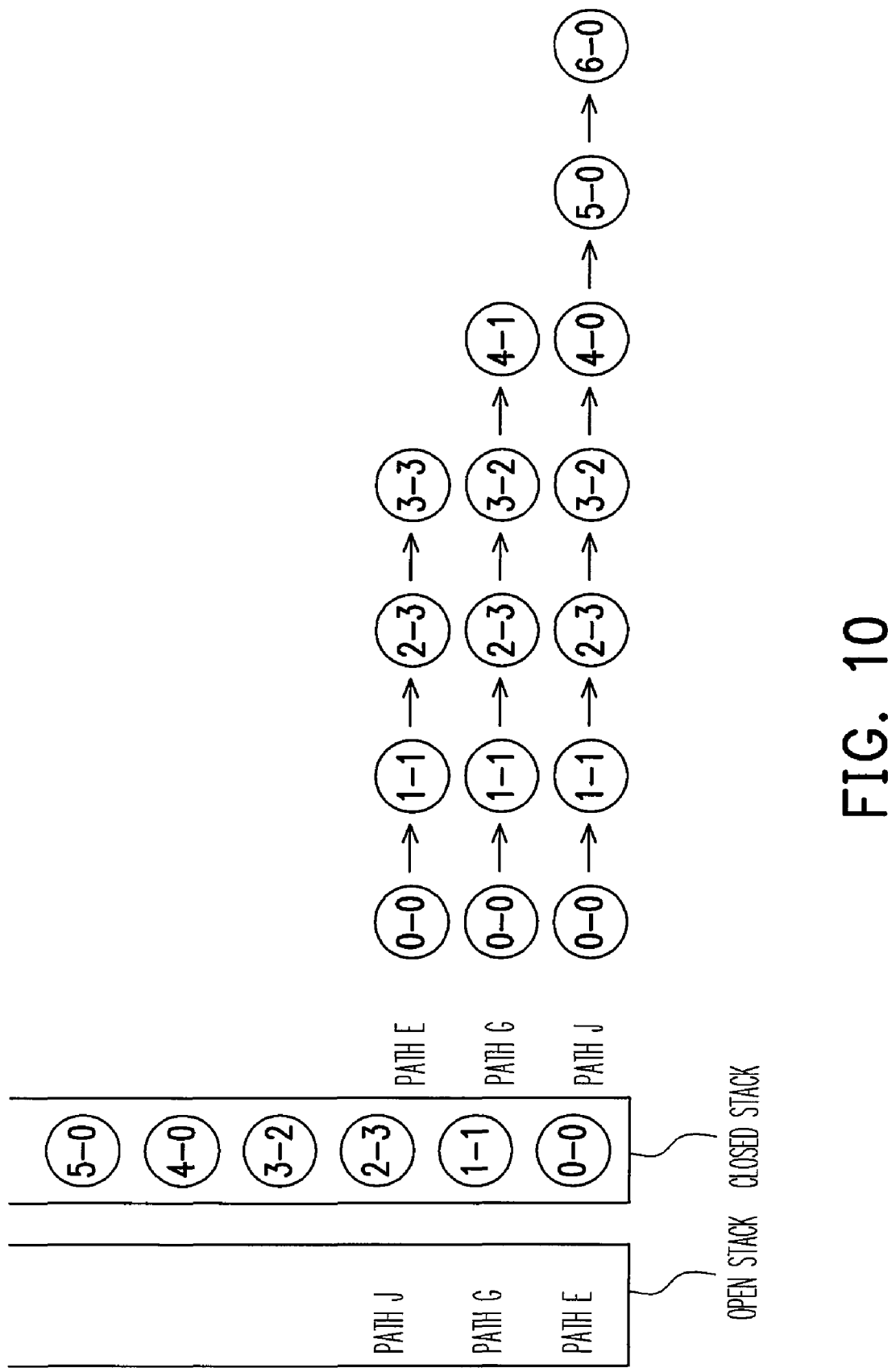
FIG. 10 illustrates paths stored in an open stack and nodes stored in a closed stack.

Because path D has been deleted, the smallest metric path in the open stack is path I, and through the expressions in steps S320 and S330, the maximum level is set to the level of the end node of path I, thus, here the maximum level is 5. Path J (for example, path 0-0→1-1→2-3→3-2→4-0→5-0→6-0 in FIG. 1) is extended from the end node 5-0 of path I, and the metric of path J is calculated to be $M_2=12$, node 5-0 is placed into the closed stack, and path I is deleted. After that, path J is placed into the open stack, and the sequence of the paths in the open stack is as paths J, G, E, the information of the open stack and the closed stack here is illustrated in FIG. 10. FIG. 10 illustrates paths stored in an open stack and nodes stored in a closed stack. Because path J has reached the goal node 6-0 of the trellis diagram, path J is the optimum path in FIG. 1. The codeword corresponding to path J in FIG. 1 is 111 010 110 011 000 000, and the message sequence can be decoded as 110000 from path J.

In the embodiment described above, if the same conditions and the same received signal are applied in conventional sequential decoding method, the same path will be decoded. However, during the decoding procedure, path A in the open stack in FIG. 8 and path D in the open stack in FIG. 9 cannot be deleted, thus, extra steps and calculations have to be used to determine that the successor paths extended from the end nodes of path A and path D are not likely to be the optimum path in the trellis diagram. Contrarily, in the present invention, paths unlikely to become the optimum path can be determined and deleted in advance to avoid executing extra steps, so that calculation quantity and decoding time can be reduced.

The near maximum-likelihood sequential decoding method described in foregoing embodiments can be simulated with a program. The simulative diagrams thereof under different encoding conditions are illustrated below in FIGS. 11~16, and because the conventional maximum-likelihood sequential decoding method (the maximum-likelihood sequential decoding method provided by Yunghsiang S. Han in "A Maximum-Likelihood Soft-Decision Sequential Decoding Algorithm for Binary Convolutional Codes") presents to be the optimum decoding method regarding error rate, the conventional maximum-likelihood sequential decoding method (referred to as MLSDA thereinafter) and the near maximum-likelihood sequential decoding method (referred to as near-MLSDA thereinafter) illustrated in FIG. 3 are used as the decoding method in all the following simulative diagrams, and all the transmission channels are assumed to be AWGN channel.

Figure 11:
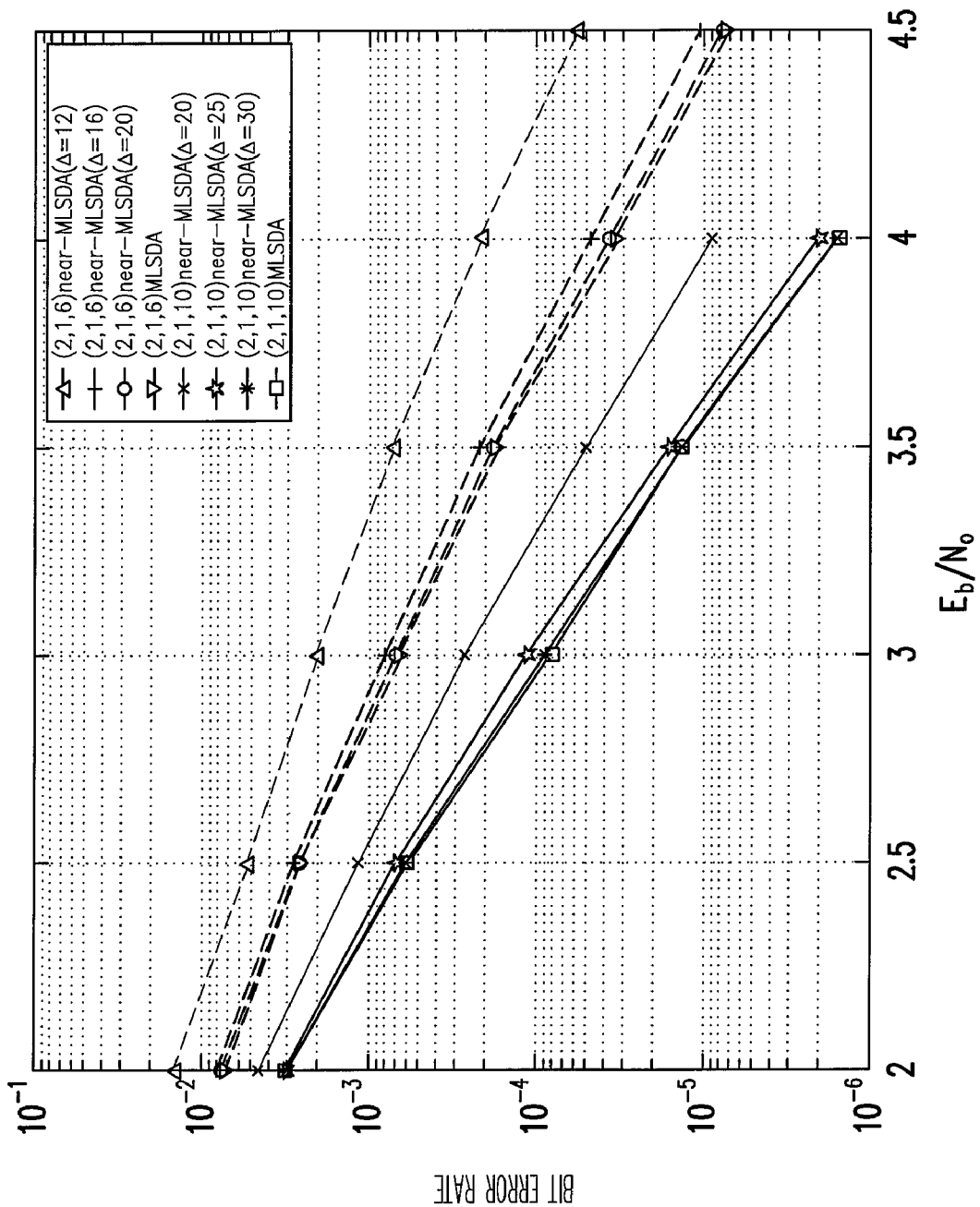
FIG. 11 is a trend diagram illustrating the bit error rates of convolution codes (2,1,6) and (2,1,10) in different sequential decoding methods with a message sequence of length 100.

FIG. 11 is a run diagram illustrating the bit error rates of convolution codes (2,1,6) and (2,1,10) in different sequential decoding methods with a message sequence of length 100. Referring to FIG. 11, the abscissa denotes the signal to noise ratio $E_b/N_0$, the unit thereof is dB, the ordinate denotes bit error rate. The decoding methods are respectively MLSDA and near-MLSDA of different level thresholds (denoted as Δ below). It can be observed from FIG. 11 that as to near-MLSDA with convolution code (2,1,6) and level threshold Δ=20, and near-MLSDA with convolution code (2,1,10) and level threshold Δ=30, the bit error rate curves thereof are almost the same as the curve of MLSDA, accordingly, near-MLSDA with convolution code (2,1,6) and level threshold Δ≧20, and near-MLSDA with convolution code (2,1,10) and level threshold Δ≧30 are the optimum decoding methods in bit error rate performance.

Figure 12:
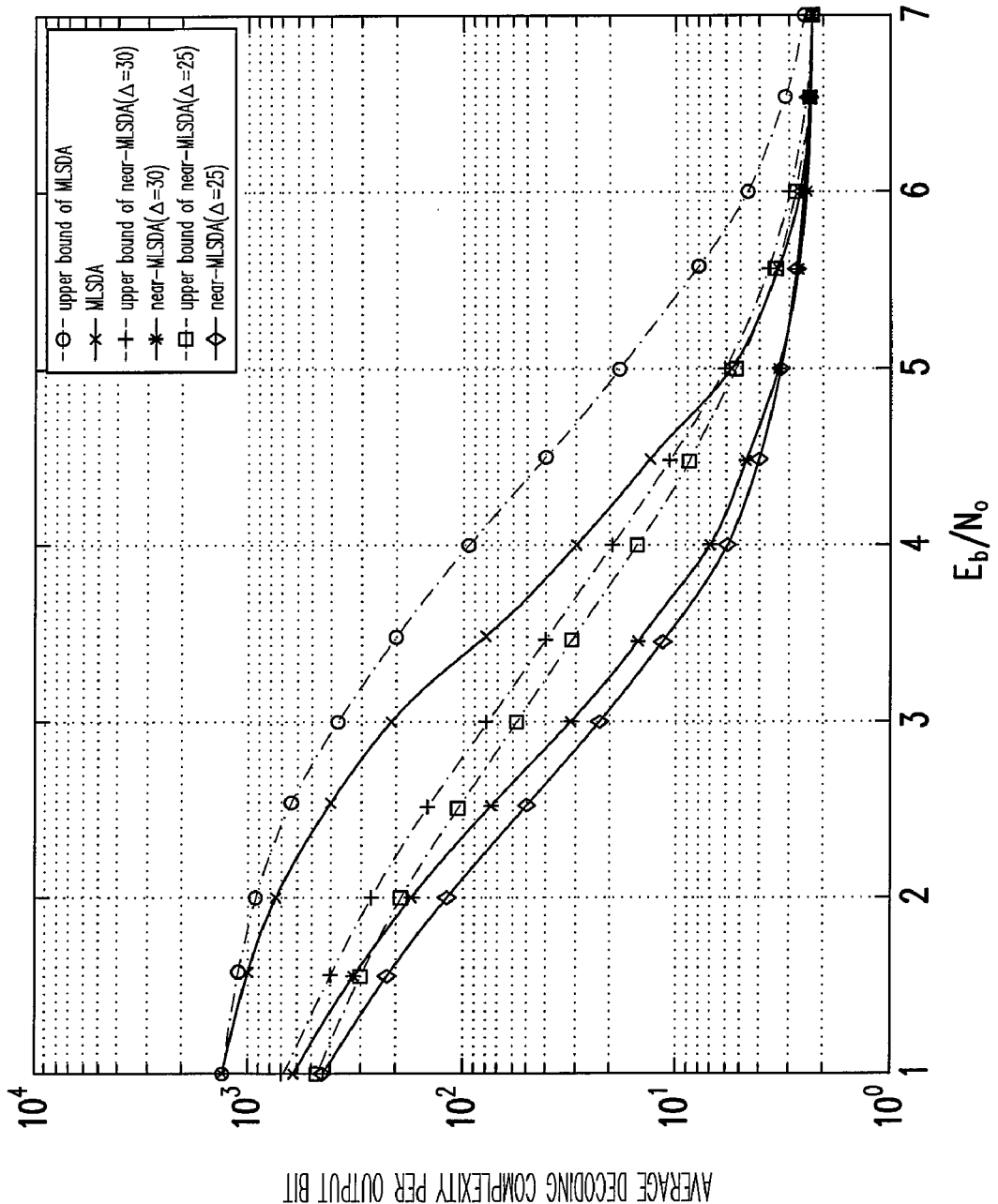
FIG. 12 is a trend diagram illustrating the average decoding complexity per output bit of a convolution code (2,1,10) in different sequential decoding methods with a message sequence of length 100.

FIG. 12 is a run diagram illustrating the average decoding complexity per output bit of a convolution code (2,1,10) in different sequential decoding methods with a message sequence of length 100. Referring to FIG. 12, the abscissa denotes the signal to noise ratio $E_b/N_0$, and the unit thereof is dB, the ordinate denotes the average decoding complexity per output bit. The decoding methods are respectively MLSDA and near-MLSDA with level thresholds Δ=25 and Δ=30.

It can be observed from FIG. 12 that when the signal to noise ratio $E_b/N_0$ is smaller than or equal to 5 dB, the decoding complexity of near-MLSDA is obviously smaller than that of MLSDA. In FIG. 12, when the signal to noise ratio $E_b/N_0$ is fixed to 3.5 dB, the average decoding complexity as to MLSDA and near-MLSDA with Δ=30 and Δ=25 are respectively 79.78, 14.08, and 10.80. That is, near-MLSDA reduces 80% decoding complexity. As to viterbi decoding method, the decoding complexity thereof is 2048, that is, the decoding complexity is slightly greater than 145 times of that of near-MLSDA with Δ=25 when viterbi decoding is used. Moreover, each of the three decoding methods in FIG. 12 has a curve representing its upper bound, and it can be observed from the three curves that the decoding complexity of near-MLSDA is still smaller than that of MLSDA even at the worse situation.

Figure 13:
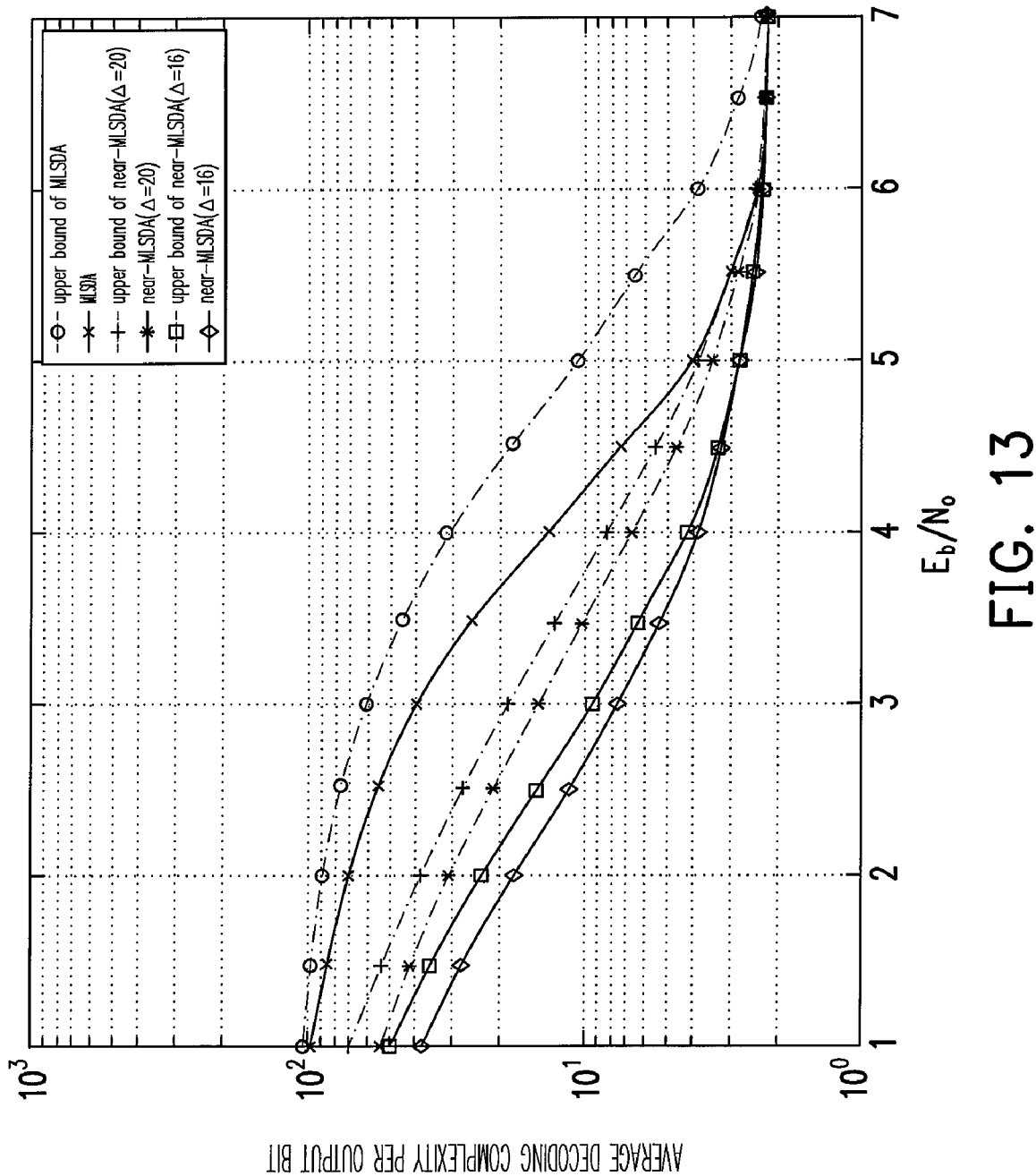
FIG. 13 is a trend diagram illustrating the average decoding complexity per output bit of a convolution code (2,1,6) in different sequential decoding methods with a message sequence of length 100.

FIG. 13 is a run diagram illustrating the average decoding complexity per output bit of a convolution code (2,1,6) in different sequential decoding methods with a message sequence of length 100. Referring to FIG. 13, the abscissa and ordinate thereof are the same as those in FIG. 12. The decoding methods are respectively MLSDA and near-MLSDA with level threshold $\Delta=16$ and $\Delta=25$. It can be observed from FIG. 13 that the decoding complexity of near-MLSDA is obviously smaller than that of MLSDA.

It can be concluded from FIGS. 11, 12, and 13 that the near-MLSDA provided by the present invention has the same advantages as conventional MLSDA in bit error rate performance, and moreover, it can reduce decoding complexity and calculation quantity, accordingly, decoding time and cost can also be reduced. FIGS. 12 and 13 have illustrated the relationship between decoding complexity and signal to noise ratio $E_b/N_0$. However, decoding complexity is not only related to the signal to noise ratio $E_b/N_0$, but also related to the message sequence length L and the memory length m, thus, below the changes of decoding complexity along with the changes of the message sequence length L and the memory length m will be respectively illustrated.

Figure 14:
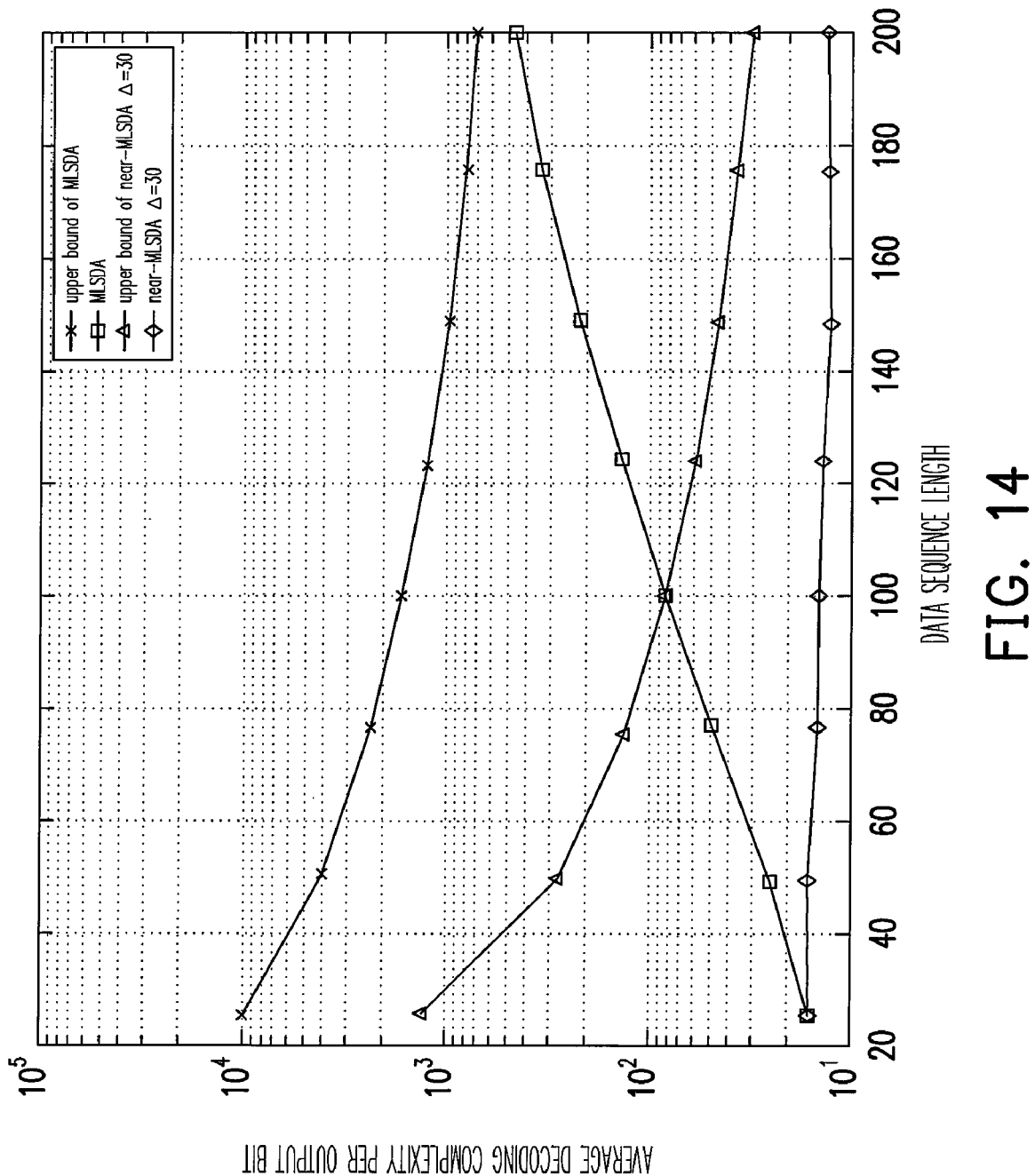
FIG. 14 is a trend diagram illustrating the average decoding complexity per output bit of a convolution code (2,1,10) changes along the length L of a message sequence in near-MLSDA and MLSDA methods with signal to noise ratio $E_b/N_0$=3.5 dB.

FIG. 14 is a run diagram illustrating the average decoding complexity per output bit of a convolution code (2,1,10) changes along the length L of a message sequence in near-MLSDA and MLSDA methods with the signal to noise ratio $E_b/N_0=3.5$ dB. Referring to FIG. 14, the abscissa denotes the message sequence length L, and the ordinate denotes the average decoding complexity per output bit. The four curves in FIG. 14 are respectively the simulative curves and upper bounds when using MLSDA and near-MLSDA with $\Delta=30$ as the decoding method.

It can be observed from FIG. 14 that as to the curve when using MLSDA as the decoding method, the average decoding complexity per output bit thereof increases obviously along with the increase of the message sequence length L. For example, while MLSDA is used as the decoding method, the average decoding complexity per output bit is 79.78 when the message sequence length L=100. The average decoding complexity per output bit is considerably increased to 446.15 when the message sequence length L is increased to L=200. However, as to the curve when near-MLSDA with $\Delta=30$ is used as the decoding method, the average decoding complexity per output bit thereof won't increase along with the increase of the message sequence length L. For example, while near-MLSDA with level threshold $\Delta=30$ is used as the decoding method, the average decoding complexity per output bit is 14.07 when the length of the message sequence is L=100. The average decoding complexity per output bit is 12.93 when the message sequence length L is L=200.

Figure 15:
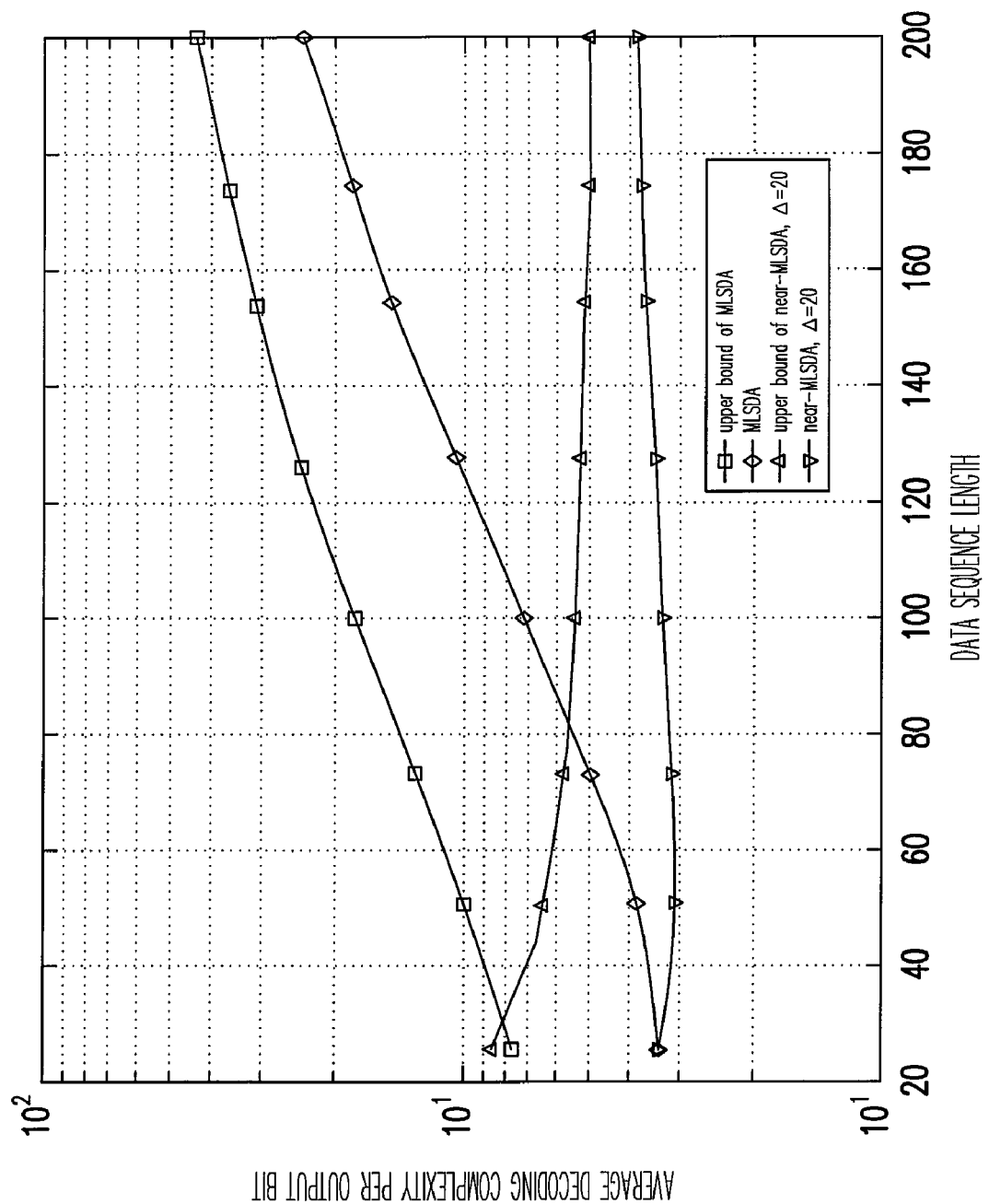
FIG. 15 is a trend diagram illustrating the average decoding complexity per output bit of a convolution code (2,1,6) changes along the length L of a message sequence in near-MLSDA and MLSDA methods with signal to noise ratio $E_b/N_0$=4.5 dB.

FIG. 15 is a run diagram illustrating the average decoding complexity per output bit of a convolution code (2,1,6) changes along the length L of a message sequence in near-MLSDA and MLSDA methods with the signal to noise ratio $E_b/N_0=4.5$ dB. Referring to FIG. 15, the abscissa and ordinate thereof are the same as those in FIG. 14. The four curves in FIG. 15 are respectively the simulative curves and upper bounds when using MLSDA and near-MLSDA with level threshold $\Delta=20$ as the decoding method. The same performance as in FIG. 14 can be observed from FIG. 15.

Figure 16:
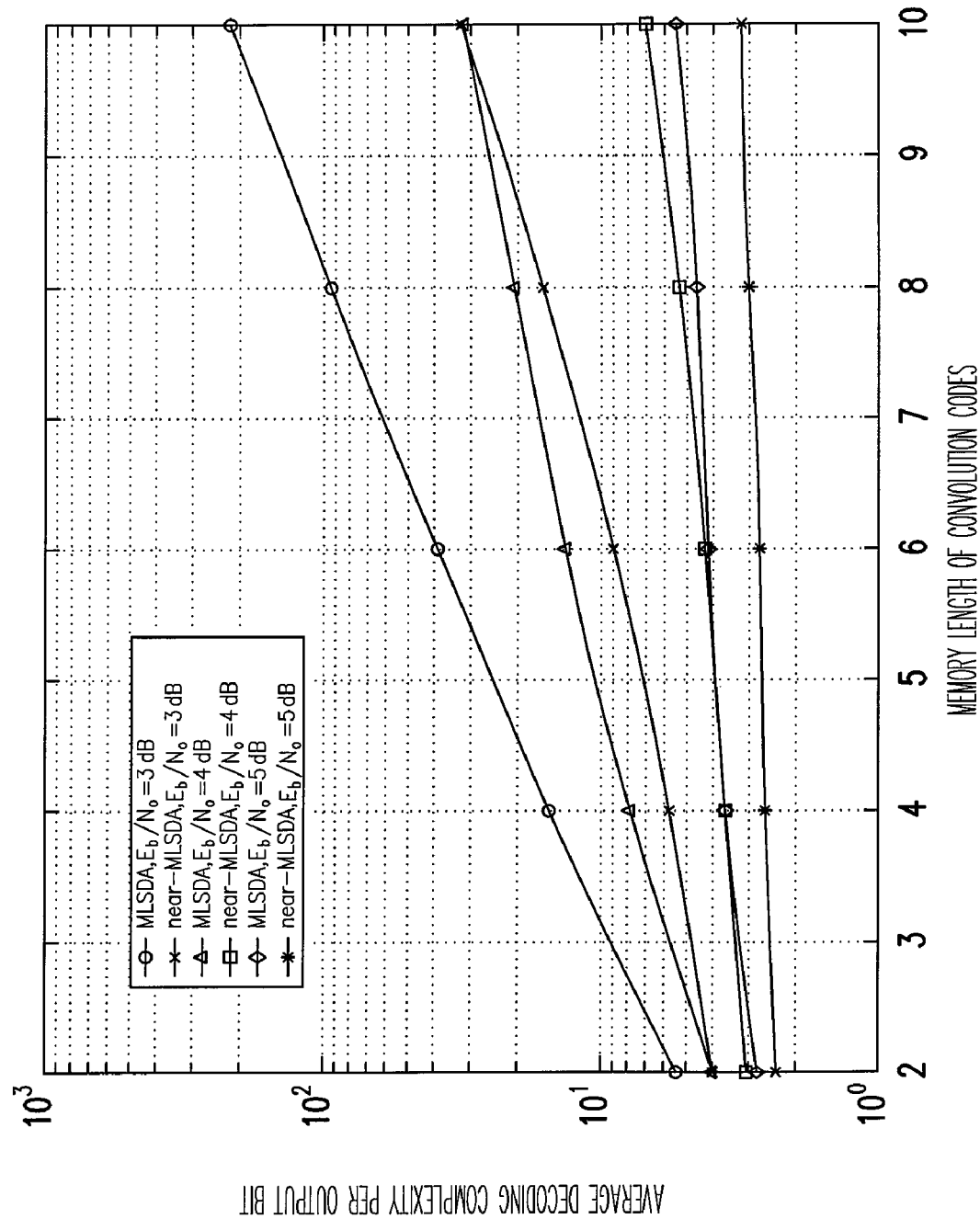
FIG. 16 is a trend diagram illustrating the average decoding complexity per output bit of a convolution code changes along the length m of a register in near-MLSDA and MLSDA methods with signal to noise ratio $E_b/N_0$ being 3, 4, and 5 dB.

FIG. 16 is a run diagram illustrating the average decoding complexity per output bit of a convolution code changes along the memory length m in near-MLSDA and MLSDA methods with the signal to noise ratio $E_b/N_0$ being 3, 4, and 5 dB. Referring to FIG. 16, the code rates k/n of the convolution code thereof are all implemented with ½, and the memory length m thereof is simulated with 2, 4, 6, 8, 10. When near-MLSDA is used as the decoding method in FIG. 16 and the memory length m is respectively simulated with 2, 4, 6, 8, 10, the level threshold $\Delta$ thereof is respectively 10, 15, 20, 25, 30 corresponding to the changes of the memory length m. It can be observed from FIG. 16 that while the signal to noise ratio is $E_b/N_0=3$ dB, the average decoding complexity increases along with the increase of the memory length m when near-MLSDA and MLSDA are used as the decoding method. However, when the signal to noise ratio $E_b/N_0$ is larger (for example, $E_b/N_0=5$ dB), it can be observed from FIG. 16 that when near-MLSDA is used as the decoding method, the average decoding complexity almost does not change along with the increase of the memory length m.

It can be concluded from FIGS. 14, 15, and 16 that the decoding complexity of near-MLSDA provided in the present invention presents a constant lower value when the data sequence length and the memory length increase. Thus, at actual transmission, large calculation quantity and decoding delay at the receiver side due to large data sequence length or memory length can be avoided in the present invention.

It can be understood from the embodiments described above that in the present invention, a level threshold is adopted to determine whether the smallest metric path in the open stack has the possibility of being the optimum path, and those paths having low possibility are deleted. However, it should be understood by those skilled in the art that in the present invention, whether to delete the path can also be determined according to the metric of the path. Or the two parameters (for example, the metric and the level threshold) can be used together to determine whether to delete the path.

Figure 17:
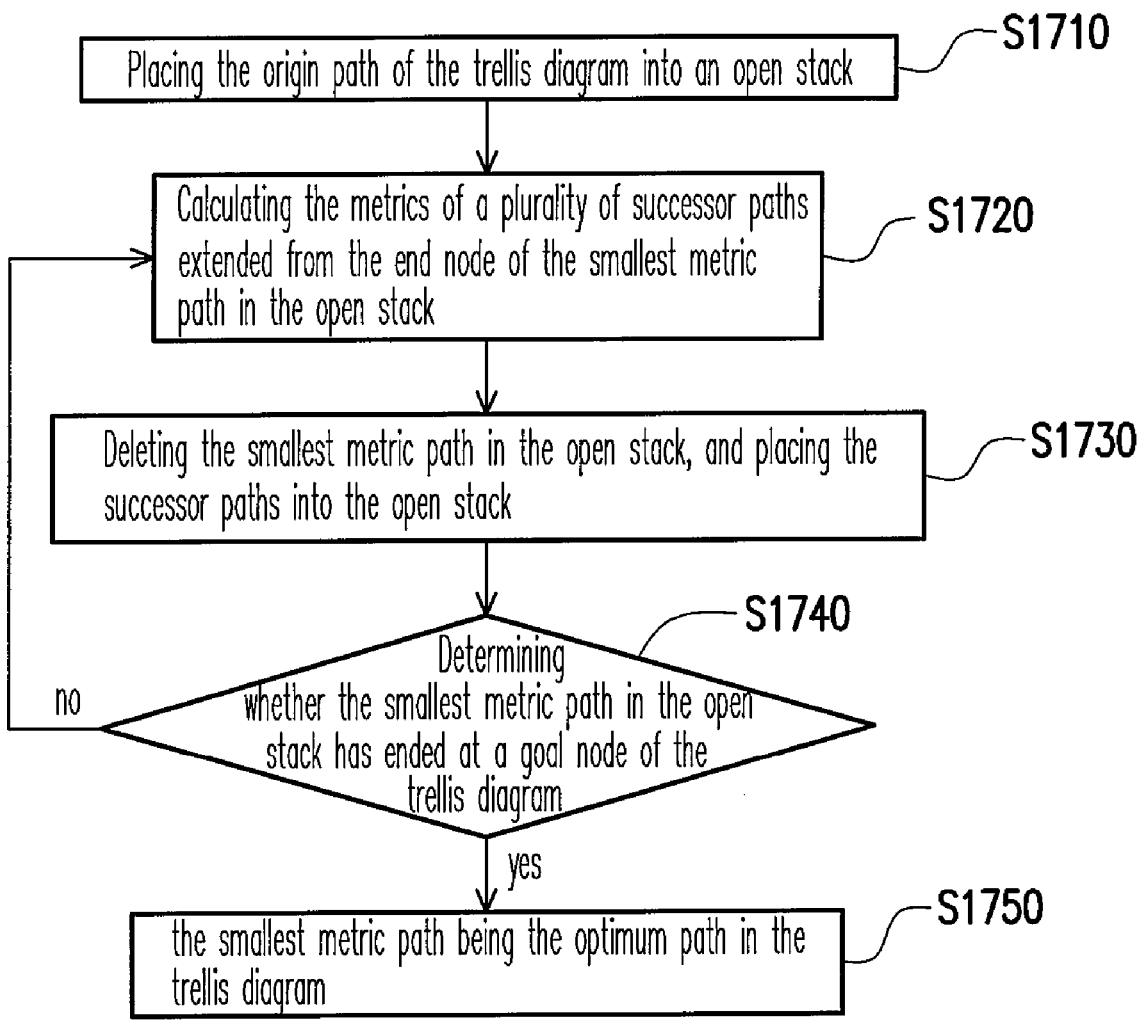
FIG. 17 is a flowchart illustrating the sequential decoding method according to another embodiment of the present invention.

FIG. 17 is a flowchart illustrating the sequential decoding method according to another embodiment of the present invention. Referring to FIGS. 1 and 17, step S1710 is the same as step S210 in FIG. 2, and step S1720 is the same as step S260 in FIG. 2, therefore they are not described herein. It should be noted that in the present embodiment, of hard-decision step can be skipped in the metric calculation in step S1720 when the definition of metric in expression (2) is adopted.

Figure 18:
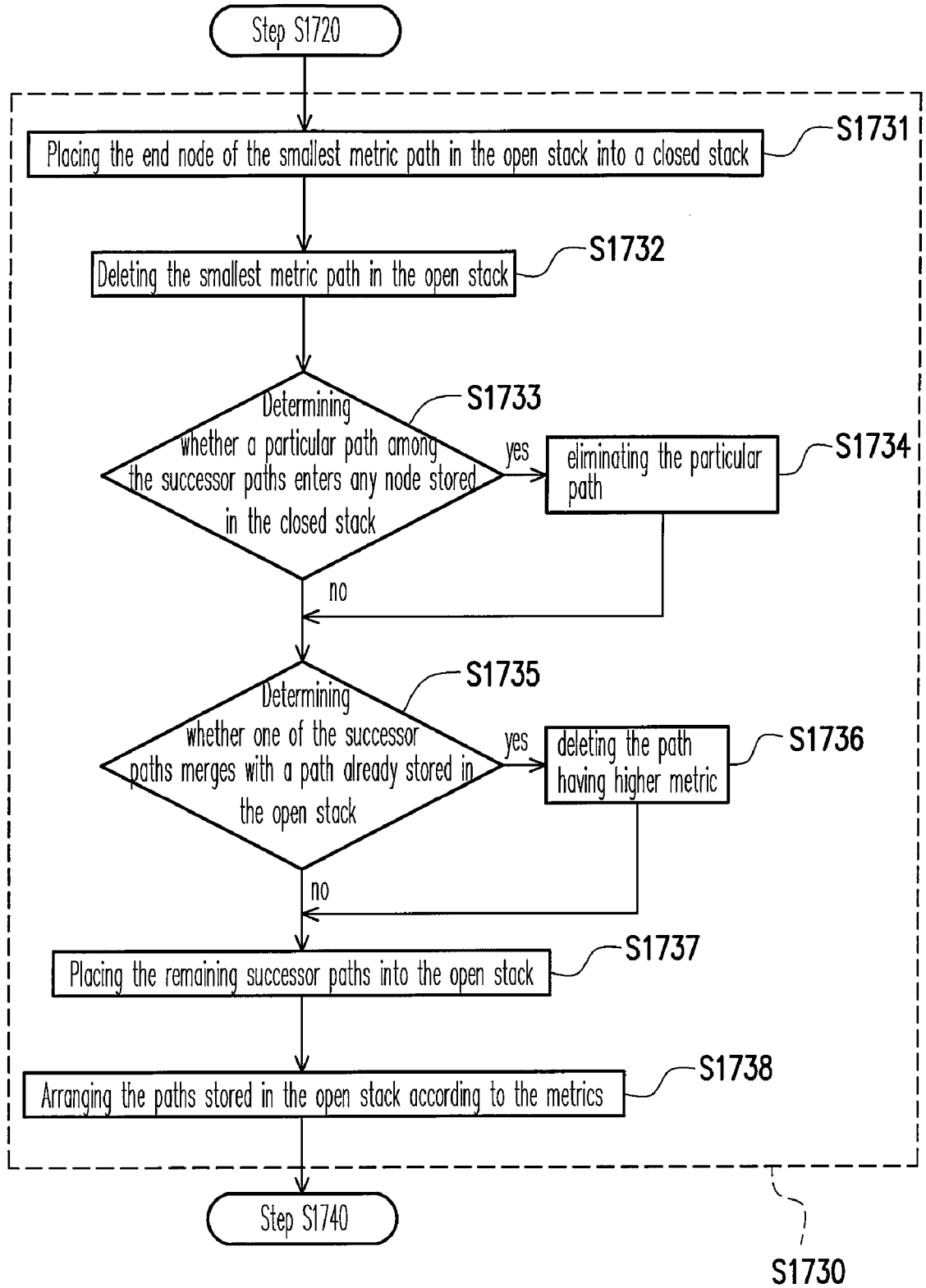
FIG. 18 illustrates the sub-steps of step S1730 in FIG. 17.

Next, the smallest metric path is deleted from the open stack and the successor paths are placed into the open stack (step S1730). Wherein, step S1730 further includes a plurality of sub-steps which are illustrated in FIG. 18. FIG. 18 illustrates the sub-steps of step S1730 in FIG. 17. Referring to FIGS. 17 and 18, the end node of the smallest metric path in the open stack is placed into a closed stack (step S1731) after step S1720. Steps S1731 and S1732 are the same as steps S350 and S355 in FIG. 3, and steps S1733~S1738 are the same as steps S361~S366 in FIG. 4, therefore they will not be described herein. Finally, steps S1740 and S1750 in FIG. 17 are the same as steps S280 and S290 in FIG. 2, therefore they will not be described herein.

In overview, according to the present invention, paths unlikely to become the maximum-likely path are deleted during the decoding process through a level threshold to reduce calculation quantity, hardware complexity, and decoding time. Moreover, in the present invention, maximum-likelihood decoding is performed through sequential decoding by adopting a metric, so that a received signal does not have to go through a hard decision procedure. However, in actual application, the present invention can be easily implemented in an integrated circuit as hardware, or directly accomplished with software, which is, for example, applied to digital signal processing (DSP) platform. However, it should be understood by those skilled in the art that the present invention is not limited to such application.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for near maximum-likelihood sequential decoding, suitable for a decoding diagram with a convolution code to determine an optimum path in the decoding diagram, wherein the decoding diagram represents paths including a message sequence passing there-through when a message sequence is encoded and codewords corresponding the paths, the decoding method comprising:

(a) placing a origin node of the decoding diagram into an open stack;

(b) comparing a level threshold, wherein when the difference between a level of an end node of a smallest metric path in the open stack and a maximum level being greater than or equal to the level threshold, the smallest metric path in the open stack is deleted, the step of comparing a level threshold is continued until the difference between the level of the end node of the smallest metric path in the open stack and the maximum level is smaller than the level threshold;

(c) determining whether the level of the end node of the smallest metric path in the open stack being more than the maximum level, if so, assigning the maximum level as the level of the end node in the open stack and proceeding to step (d), otherwise, proceeding to step (d);

(d) calculating the metrics of a plurality of successor paths extended from the end node of the smallest metric path in the open stack;

(e) deleting the smallest metric path in the open stack and placing the successor paths into the open stack; and (f) determining whether the smallest metric path in the open stack having ended at a goal node of the decoding diagram, wherein if the smallest metric path in the open stack has not ended at the goal node of the decoding diagram, steps (b)~(f) are repeated, if the smallest metric path in the open stack has ended at the end node of the decoding diagram, the smallest metric path is the optimum path in the decoding diagram.

2. The near maximum-likelihood sequential decoding method as claimed in claim 1, wherein the decoding diagram comprises a trellis diagram.

3. The near maximum-likelihood sequential decoding method as claimed in claim 1, wherein the decoding diagram comprises a tree diagram.

4. The near maximum-likelihood sequential decoding method as claimed in claim 1, further comprising the following steps before performing the step (a):

setting a value as the level threshold, wherein a maximum of the value is zero.

5. The near maximum-likelihood sequential decoding method as claimed in claim 1, wherein the metric of the origin node is 0.

6. The near maximum-likelihood sequential decoding method as claimed in claim 1, wherein the open stack is used for storing a plurality of paths, and the paths have a possibility of being the optimum path.

7. The near maximum-likelihood sequential decoding method as claimed in claim 1, wherein step (e) further comprises the following steps:

(e1) placing the end node of the smallest metric path in the open stack into a closed stack;

(e2) deleting the smallest metric path in the open stack; and (e3) placing the successor paths into the open stack.

8. The near maximum-likelihood sequential decoding method as claimed in claim 7, wherein step (e3) further comprises the following steps:

eliminating a particular path when the particular path in the successor paths entering any node stored in the closed stack;

eliminating a path having higher metric when one of the successor paths merging with a path already stored in the open stack;

placing the remaining successor paths into the open stack; and arranging the paths stored in the open stack according to their metrics.

9. The near maximum-likelihood sequential decoding method as claimed in claim 1, wherein the convolution code is used for encoding k data bits into n bit codewords, the $j^{th}$ codeword corresponding to the path in the decoding diagram is denoted as $x_j$, and $x_j \in \{0,1\}$, the level of the path of the decoding diagram is denoted as l, the metrics are $$\sum_{j=0}^{l \times n-1}(2x_j-1) \times \phi_j + \sum_{j=0}^{l \times n-1}|\phi_j|,$$

wherein k and n are natural numbers, j and l are integers, $\phi_j$ is a log-likelihood ratio, and $\phi_j$ is a real number.

10. The near maximum-likelihood sequential decoding method as claimed in claim 9, wherein $\phi_j$ is log $[Pr(r_j|0)/Pr(r_j|1)]$, $r_j$ is a $j^{th}$ received signal, $Pr(r_j|0)$ represents the possibility of receiving $r_j$ when transmitting 0, and $Pr(r_j|1)$ represents the possibility of receiving $r_j$ when transmitting 1.

11. The near maximum-likelihood sequential decoding method as claimed in claim 1, wherein the convolution code is used for encoding k data bits into n bit codewords, the $j^{th}$ codeword corresponding to the path in the decoding diagram is denoted as $x_j$, and $x_j \in \{0,1\}$, the level of the path of the decoding diagram is denoted as l, and the metric is $$\sum_{j=0}^{l \times n-1}(y_j \oplus x_j)|\phi_j|,$$

wherein k and n are natural numbers, j and l are integers, $\phi_j$ is a log-likelihood ratio, $\phi_j$ is real number, and $y_j$ is a hard-decision value.

12. The near maximum-likelihood sequential decoding method as claimed in claim 11, wherein $\phi_j$ is ln $[Pr(r_j|0)/Pr(r_j|1)]$, $r_j$ is the $j^{th}$ received signal, $Pr(r_j|0)$ represents the possibility of receiving $r_j$ when transmitting 0, and $Pr(r_j|1)$ represents the possibility of receiving $r_j$ when transmitting 1.

13. The near maximum-likelihood sequential decoding method as claimed in claim 11, wherein when $\phi_j<0$, $y_j=1$ is determined, and when $\phi_j \geq 0$, $y_j=0$ is determined.

14. A sequential decoding method, suitable for a decoding diagram of a convolution code to determine an optimum path in the decoding diagram, wherein the convolution code encodes k data bits into n bit codewords, and the decoding diagram represents the paths including a message sequence passing there-through when the message sequence is encoded and codewords corresponding the paths, a $j^{th}$ codeword corresponding to the path of the decoding diagram is denoted as $x_j$, and $x_j \in \{0,1\}$, a level of the path of the decoding diagram is denoted as l, the decoding method comprising:
- (a) placing a origin node of the decoding diagram to an open stack;
- (b) calculating the metrics of a plurality of successor paths extended from an end node of a smallest metric path in the open stack, the metric thereof being $$\sum_{j=0}^{l \times n-1} (2x_j - 1) \times \phi_j + \sum_{j=0}^{l \times n-1} |\phi_j|,$$

and $\phi_j$ is a log-likelihood ratio;
- (c) deleting the smallest metric path in the open stack and placing the successor paths into the open stack; and
- (d) determining whether the smallest metric path in the open stack having ended at a goal node of the decoding diagram wherein if the smallest metric path in the open stack has not ended at the goal node of the decoding diagram, steps (b)~(d) are repeated, if the smallest metric path in the open stack has ended at the goal node of the decoding diagram, the smallest metric path is the optimum path in the decoding diagram.

15. The sequential decoding method as claimed in claim 14, wherein k and n are natural numbers, j and l are integers, $\phi_j$ is a real number, the value of $\phi_j$ is $\log[\Pr(r_j|0)/\Pr(r_j|1)]$, $r_j$ is a $j^{th}$ received signal, $\Pr(r_j|0)$ represents the possibility of receiving $r_j$ when transmitting 0, and $\Pr(r_j|1)$ represents the possibility of receiving $r_j$ when transmitting 1.

16. The sequential decoding method as claimed in claim 14, wherein the decoding diagram comprises a trellis diagram.

17. The sequential decoding method as claimed in claim 14, wherein the decoding diagram comprises a tree diagram.

18. The sequential decoding method as claimed in claim 14, wherein the metric of the origin node is 0.

19. The sequential decoding method as claimed in claim 14, wherein the open stack is used for storing a plurality of paths, and the paths have a possibility of being the optimum path.

20. The sequential decoding method as claimed in claim 14, wherein step (c) further comprises the following steps:
- (c1) placing the end node of the smallest metric path in the open stack to a closed stack;
- (c2) deleting the smallest metric path in the open stack; and
- (c3) placing the successor paths into the open stack.

21. The sequential decoding method as claimed in claim 20, wherein step (c3) further comprises the following steps:
- eliminating a particular path when the particular path of the successor paths entering any node stored in the closed stack;
- eliminating a path having higher metric when one of the successor paths merging with the path already stored in the open stack;
- placing the remaining successor paths into the open stack; and
- arranging the path stored in the open stack according to their metrics.

* * * * *